United States Patent
Nishimura et al.

(10) Patent No.: US 8,551,289 B2
(45) Date of Patent: Oct. 8, 2013

(54) PLASMA PROCESSING APPARATUS

(75) Inventors: Eiichi Nishimura, Nirasaki (JP); Shimao Yoneyama, Kai (JP)

(73) Assignees: Tokyo Electron Limited, Tokyo (JP); Meiko Co., Ltd., Kai-Shi (JP)

( * ) Notice: Subject to any disclaimer, the term of this patent is extended or adjusted under 35 U.S.C. 154(b) by 396 days.

(21) Appl. No.: 12/769,099

(22) Filed: Apr. 28, 2010

(65) Prior Publication Data
US 2010/0269980 A1    Oct. 28, 2010

(30) Foreign Application Priority Data

Apr. 28, 2009 (JP) .................. 2009-108752

(51) Int. Cl.
C23C 16/00 (2006.01)
C23F 1/00 (2006.01)
H01L 21/306 (2006.01)
H05B 31/26 (2006.01)

(52) U.S. Cl.
USPC .............. 156/345.48; 118/723 I; 118/723 IR; 156/345.49; 315/111.51

(58) Field of Classification Search
USPC ........ 118/723 I, 723 IR; 156/345.48, 345.49; 315/111.51
See application file for complete search history.

(56) References Cited

U.S. PATENT DOCUMENTS

| | | |
|---|---|---|
| 4,289,188 A | 9/1981 | Mizutani et al. |
| 4,430,151 A | 2/1984 | Tsukada |
| 4,491,499 A | 1/1985 | Jerde et al. |
| 4,918,031 A | 4/1990 | Flamm et al. |
| 4,950,956 A | 8/1990 | Asamaki et al. |
| 5,014,217 A | 5/1991 | Savage |
| 5,068,002 A | 11/1991 | Monroe |
| 5,234,529 A | 8/1993 | Johnson |
| 5,241,245 A | 8/1993 | Barnes et al. |
| 5,261,962 A | 11/1993 | Hamamoto et al. |
| 5,273,609 A | 12/1993 | Moslehi |
| 5,277,751 A | 1/1994 | Ogle |
| 5,280,154 A | 1/1994 | Cuomo et al. |
| 5,304,279 A | 4/1994 | Coultas et al. |
| 5,304,282 A | 4/1994 | Flamm |
| 5,308,414 A | 5/1994 | O'Neill et al. |
| 5,318,806 A | 6/1994 | Montgomery et al. |
| 5,346,578 A | 9/1994 | Benzing et al. |

(Continued)

FOREIGN PATENT DOCUMENTS

| | | |
|---|---|---|
| JP | 55-59726 | 5/1980 |
| JP | 7-296992 | 11/1995 |
| JP | 2007-142444 | 6/2007 |

*Primary Examiner* — Rakesh Dhingra
(74) *Attorney, Agent, or Firm* — Oblon, Spivak, McClelland, Maier & Neustadt, L.L.P.

(57) ABSTRACT

A plasma processing apparatus, for performing a plasma processing on a target substrate by generating an inductively coupled plasma of a processing gas in a depressurized processing chamber, includes: a mounting table; a gas supply unit; a gas exhaust unit; a planar high frequency antenna disposed opposite to the mounting table with a plate-shaped dielectric member therebetween and a shield member covering the high frequency antenna. The high frequency antenna includes an inner antenna element provided at a central portion of a region above the plate-shaped dielectric member and an outer antenna element provided at an edge portion to surround a periphery of the inner antenna element. Further, two ends of each of the antenna elements are open ends and the antenna elements are grounded at central points thereof or points close thereto to resonate at ½ wavelengths of high frequencies from individual high frequency power supplies.

19 Claims, 20 Drawing Sheets

(56) References Cited

U.S. PATENT DOCUMENTS

| | | | |
|---|---|---|---|
| 5,401,350 A | 3/1995 | Patrick et al. | |
| 5,540,800 A | 7/1996 | Qian | |
| 5,556,501 A | 9/1996 | Collins et al. | |
| 5,571,366 A * | 11/1996 | Ishii et al. | 156/345.26 |
| 5,685,942 A * | 11/1997 | Ishii | 156/345.48 |
| 5,716,451 A * | 2/1998 | Hama et al. | 118/723 I |
| 5,919,382 A * | 7/1999 | Qian et al. | 219/121.52 |
| 5,965,034 A | 10/1999 | Vinogradov et al. | |
| 6,017,221 A | 1/2000 | Flamm | |
| 6,127,275 A | 10/2000 | Flamm | |
| 6,225,746 B1 | 5/2001 | Wickramanayaka | |
| 6,229,264 B1 * | 5/2001 | Ni et al. | 315/111.51 |
| 6,319,355 B1 * | 11/2001 | Holland | 156/345.48 |
| 6,475,334 B1 * | 11/2002 | Harano | 156/345.48 |
| 6,551,447 B1 * | 4/2003 | Savas et al. | 156/345.48 |
| 6,858,112 B2 | 2/2005 | Flamm et al. | |
| 2003/0062840 A1 * | 4/2003 | Moroz | 315/111.51 |
| 2003/0213434 A1 * | 11/2003 | Gondhalekar et al. | 118/724 |
| 2007/0113981 A1 * | 5/2007 | Brcka | 156/345.48 |

* cited by examiner

PRESSURE INSIDE OF PROCESSING CHAMBER [Pa]

US 8,551,289 B2

PLASMA PROCESSING APPARATUS

CROSS-REFERENCE TO RELATED APPLICATIONS

This application claims priority to Japanese Patent Application No. 2009-108752 filed on Apr. 28, 2009, the entire contents of which are incorporated herein by reference.

FIELD OF THE INVENTION

The present invention relates to a plasma processing apparatus for performing predetermined processing on a substrate to be processed by exciting a plasma of a processing gas.

BACKGROUND OF THE INVENTION

A plasma processing apparatus is used for various processing such as etching, ashing, plasma deposition and the like for a substrate to be processed, e.g., a semiconductor wafer, a flat panel display (FPD) substrate, or the like. As for the plasma processing apparatus, there is known, e.g., an apparatus in which a planar spiral coil having both ends grounded is provided above a dielectric member and a high frequency power supply is connected to a portion other than the both ends (see, e.g., Patent Document 1). Further, there is formed a standing wave by applying a high frequency power from the high frequency power supply to the spiral coil to make the spiral coil resonate at ½ wavelength (or ¼ wavelength) of the high frequency. Accordingly, an induction field is generated below the dielectric member, and a plasma of a processing gas is excited.
(Patent Document 1)
Japanese Patent Application Publication No. H7-296992 and corresponding U.S. Pat. No. 5,241,245
(Patent Document 2)
Japanese Patent Application Publication No. 2007-142444 and corresponding U.S. Pat. No. 5,965,034

Meanwhile, along with the recent trends toward miniaturized and multilayered semiconductor devices, it is required to perform processing that causes less damage. For example, when the processing is performed by using radicals, it is required to facilitate reaction caused by the radicals while minimizing ion damage. Namely, various studies are being conducted to avoid damage caused by excessive ions, such as mixture of materials forming layers of a wafer, destruction of an oxide film, intrusion of contaminants, change in the characteristics or the like. Further, ion impact that causes a low selectivity needs to be avoided during an etching process or the like that requires a selectivity with high accuracy. Besides, it is known that the ion damage can be effectively suppressed by exciting a plasma having a potential set as low as possible.

However, when both ends of the spiral coil are grounded as in the above-described plasma processing apparatus, even if a standing wave is formed by having the spiral coil to resonate at ½ wavelength (or ¼ wavelength) of the high frequency, the spiral coil has only a positive or a negative voltage component without having those together at the same time. Therefore, the voltage component remains in the spiral coil all the time, and a large amount of capacitively coupled components is generated in the plasma, which makes it difficult to prevent ion damage.

In order to reduce the amount of capacitively coupled components in the plasma, the amount of voltage component remaining in the spiral coils needs to be reduced. The amount of capacitively coupled components in the plasma can be reduced by using the spiral coil having a low inductance as described in Patent Document 1. However, in case of using the spiral coil having the low inductance, the excited magnetic field becomes weak. As a result, it is difficult to generate an intense inductively coupled plasma, and a plasma density decreases.

In the Patent Document 2, a spiral coil is wound around an evacuable reaction chamber elongated in a longitudinal direction to form a standing wave by having the spiral coil to resonate in a full wavelength mode, a ½ wavelength mode or the like by applying a high frequency of a predetermined wavelength thereto and excite a plasma of a processing gas by forming an induction field in the reaction chamber. A voltage waveform is controlled by a wavelength control circuit for a phase and an anti-phase voltage to be symmetrical with respect to a point where the phase and the anti-phase voltage are switched, so that an inductively coupled plasma can be excited at a node having a zero potential at which the phase voltage is switched.

Since the antenna element is formed in a longitudinally wound spiral coil shape in the Patent Document 2, the waveform can be controlled by the wavelength control circuit so as to be symmetrical with respect to the point where the phase-voltage and the anti-phase voltage are switched. On the other hand, unlike the antenna element formed in the longitudinally wound spiral coil shape, an antenna element formed in the planar coil shape has a diameter gradually increasing from an inner end toward an outer end on the same plane. Thus, an inner line and an outer line divided by the point where the phase-voltage and the anti-phase voltage are switched have different reactances, and this makes it difficult to control the waveform to be symmetrical with respect to the point. Accordingly, the technique applied to the spiral coil described in Patent Document 2 cannot be applied to the planar coil.

In addition, along with the demand for miniaturized and multilayered semiconductor devices, it is required to simply and accurately control uniformity of plasma processing on a central portion and an edge portion of a substrate to be processed.

SUMMARY OF THE INVENTION

In view of the above, the present invention provides a plasma processing apparatus capable of easily generating a stable high-density plasma having a low plasma potential and also capable of simply and accurately controlling uniformity of plasma processing of a substrate to be processed.

In accordance with an embodiment of the present invention, there is provided a plasma processing apparatus for performing a plasma processing on a substrate to be processed by generating an inductively coupled plasma of a processing gas in a depressurized processing chamber, the plasma processing apparatus including: a mounting table, provided in the processing chamber, for mounting thereon the substrate to be processed; a gas supply unit for introducing the processing gas into the processing chamber; a gas exhaust unit for depressurizing the inside of the processing chamber; a planar high frequency antenna disposed opposite to the mounting table with a plate-shaped dielectric member therebetween; and a shield member covering the high frequency antenna, wherein the high frequency antenna includes an inner antenna element provided at a central portion of a region above the plate-shaped dielectric member and an outer antenna element provided at an edge portion of the region above the plate-shaped dielectric member to surround a periphery of the inner antenna element, and wherein two ends of each of the antenna elements are open ends and the antenna elements are grounded at central points thereof or points close thereto to resonate at ½ wavelength of high frequencies from individual high frequency power supplies.

In accordance with another embodiment of the present invention, there is provided a plasma processing apparatus for performing a plasma processing on a substrate to be processed by generating an inductively coupled plasma of a processing gas in a depressurized processing chamber, the plasma processing apparatus including: a susceptor, provided in the processing chamber, for mounting thereon the substrate to be processed; a high frequency susceptor power supply for applying a high frequency power to the susceptor; a gas supply unit for introducing a processing gas into the processing chamber; a gas exhaust unit for depressurizing the inside of the processing chamber; a planar high frequency antenna disposed opposite to the mounting table with a plate-shaped dielectric member therebetween; and a shield member covering the high frequency antenna, wherein the high frequency antenna includes an inner antenna element provided at a central portion of a region above the plate-shaped dielectric member and an outer antenna element provided to surround a periphery of the inner antenna element, and wherein two ends of each of the antenna elements are open ends and the antenna elements are grounded at central points thereof or points close thereto to resonate at ½ wavelength of high frequencies from individual high frequency power supplies.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Figure 1:
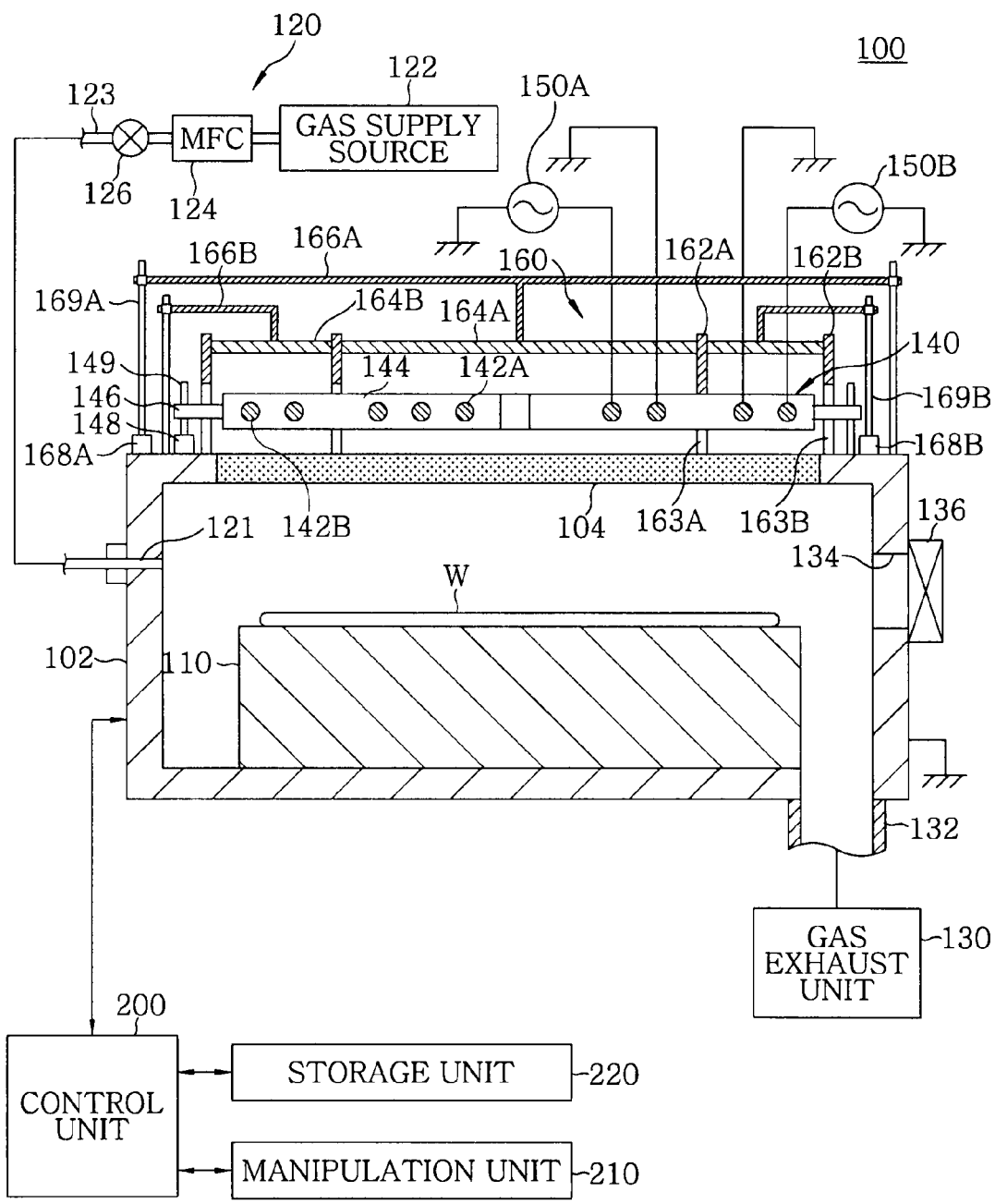
FIG. 1 is a vertical cross sectional view showing a schematic configuration of a plasma processing apparatus in accordance with an embodiment of the present invention.

The embodiments of the present invention will be described with reference to the accompanying drawings which form a part hereof. Further, like reference numerals will be given to like parts having substantially the same functions throughout the specification and the drawings, and redundant description thereof will be omitted.

(Configuration Example of Plasma Processing Apparatus)

First, a configuration example of a plasma processing apparatus 100 in accordance with an embodiment of the present invention will be described with reference to the accompanying drawings. Herein, an inductively coupled plasma processing apparatus will be described as an example. The inductively coupled plasma processing apparatus performs a predetermined plasma processing on a substrate to be processed, e.g., a semiconductor wafer W by using a plasma of a processing gas which is excited in a processing chamber by applying a high frequency power to a planar high frequency antenna.

Figure 2:
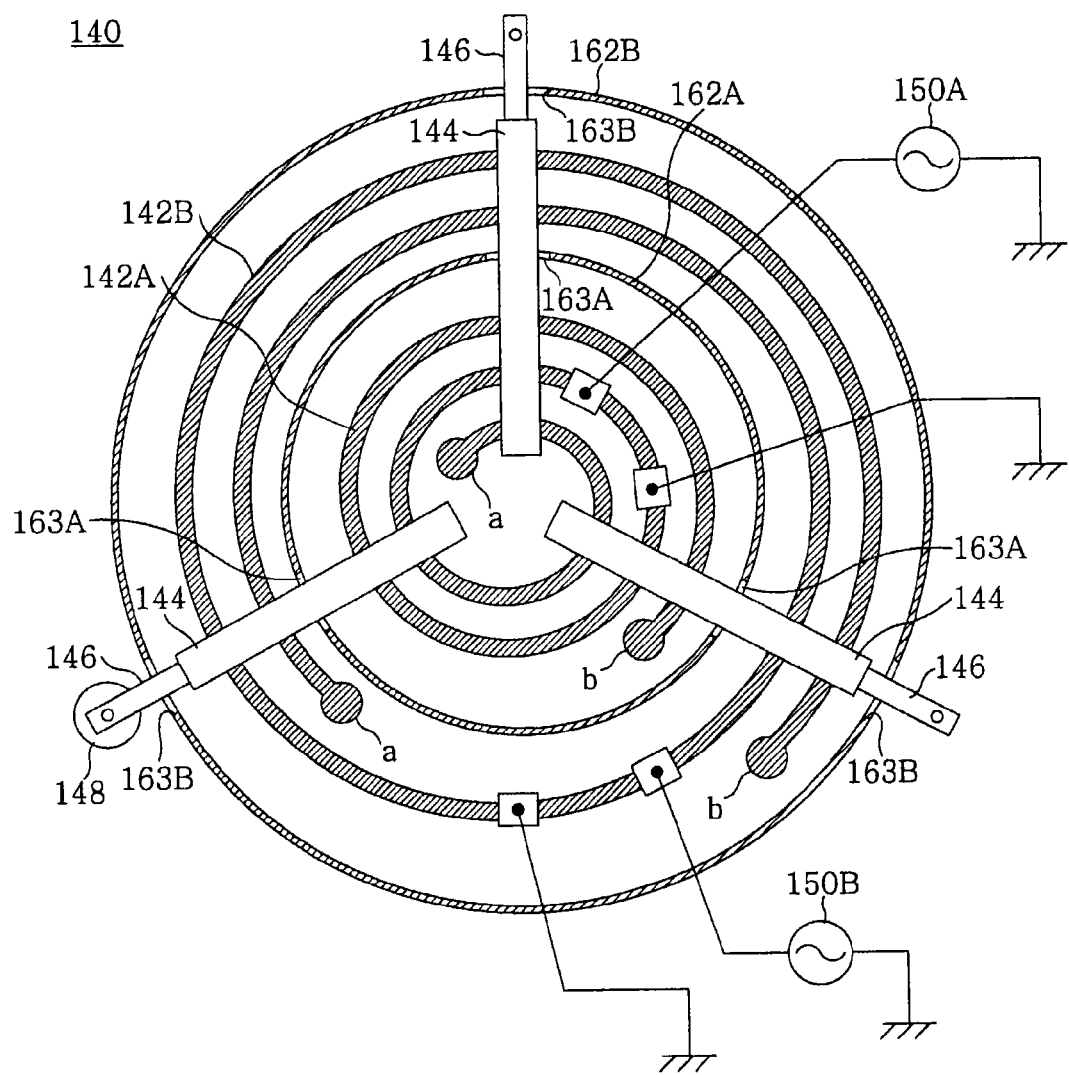
FIG. 2 illustrates a top view of a high frequency antenna shown in FIG. 1.

FIG. 1 is a cross sectional view showing a schematic configuration of the plasma processing apparatus 100 in accordance with the present embodiment; and FIG. 2 is a top view of a high frequency antenna 140 shown in FIG. 1. The plasma processing apparatus 100 includes a tubular (e.g., cylindrical) processing chamber 102 made of metal (e.g., aluminum). The shape of the processing chamber 102 is not limited to a cylindrical shape, and may be, e.g., a square columnar shape (e.g., box shape).

Provided at a bottom portion of the processing chamber 102 is a mounting table 110 for mounting thereon a wafer W. The mounting table 110 is made of aluminum or the like and formed in a substantially columnar shape (e.g., cylindrical shape). The shape of the mounting table 110 is not limited to the cylindrical shape, and may be, e.g., a prism shape having e.g., n-sided polygonal base. Further, although it is not illustrated, the mounting table 110 may be provided with functional element if necessary, e.g., an electrostatic chuck for adsorptively holding a wafer W by using Coulomb force, a temperature control mechanism such as a heater, a coolant path or the like. Such modification of the mounting table 110 will be described in detail later.

A plate-shaped dielectric member 104 made of, e.g., quartz glass, ceramic or the like, is provided at a ceiling portion of the processing chamber 102 while oppositely facing the mounting table 110. To be specific, the plate-shaped dielectric member 104 is formed in, e.g., a disk shape, and airtightly covers an opening formed at the ceiling portion of the processing chamber 102.

Provided at the processing chamber 102 is a gas supply unit 120 for supplying a processing gas for processing a wafer W or the like. The gas supply unit 120 is configured as shown in FIG. 1, for example. In other words, a gas inlet port 121 is formed at a sidewall of the processing chamber 102, and is connected to a gas supply source 122 through a gas supply line 123. Provided in the middle of the gas supply line 123 are a flow rate controller for controlling a flow rate of the processing gas, e.g., a mass flow controller (MFC) 124, and an opening/closing valve 126. The gas supply unit 120 supplies the processing gas from the gas supply source 122 into the processing chamber 102 through the gas inlet port 121 at a predetermined flow rate controlled by the MFC 124.

Although the gas supply unit 120 formed of a single gas line is shown in FIG. 1 to simplify the description, the gas supply unit 120 is not limited to a case for supplying a single processing gas. The gas supply unit 120 may be the one for supplying a plurality of processing gases. In that case, a plurality of gas supply sources may be provided along with a plurality of gas lines, and a mass flow controller may be provided in each of the gas lines. Although FIG. 1 shows an example in which a gas is supplied from the gas supply unit 120 formed at the sidewall of the processing chamber 102, a gas may be supplied through the ceiling portion of the processing chamber 102 without being limited to the above example. In that case, a gas may be supplied through a gas inlet port formed at a central portion of a plate-shaped dielectric member 104, for example.

When an oxide film is etched, a halogen-based gas containing Cl or the like is used as a processing gas supplied into the processing chamber 102 by the gas supply unit 120. To be specific, when a silicon oxide film such as an $SiO_2$ film or the like is etched, $CHF_3$ gas or the like is used as the processing gas. When a high-k dielectric thin film such as $HfO_2$, $HfSiO_2$, $ZrO_2$, $ZrSiO_4$ or the like is etched, $BCl_3$ gas or a gaseous mixture of $BCl_3$ gas and $O_2$ gas is used as the processing gas. When a polysilicon film is etched, a gaseous mixture of HBr gas and $O_2$ gas or the like is used as the processing gas.

A gas exhaust unit 130 for exhausting an atmosphere in the processing chamber 102 is connected to the bottom portion of the processing chamber 102 through an exhaust line 132. The gas exhaust unit 130 is formed as, e.g., a vacuum pump, and the processing chamber 102 is exhausted by the gas exhaust unit 130 to maintain a predetermined pressure. A wafer loading/unloading port 134 is formed at the sidewall of the processing chamber 102, and a gate valve 136 is provided at the wafer loading/unloading port 134. For example, the gate valve 136 is opened, and the wafer W is loaded and mounted on the mounting table 110 in the processing chamber 102 by a transfer mechanism such as a transfer arm or the like (not shown). Next, the gate valve 136 is closed, and the wafer W is processed.

At the ceiling portion of the processing chamber 102, a planar high frequency antenna 140 and a shield member 160 for covering the high frequency antenna 140 are disposed on an upper surface (outer surface) of the plate-shaped dielectric member 104. The high frequency antenna 140 of the present embodiment is divided into an inner antenna element 142A provided at a central portion of a region above the plate-shaped dielectric member 104 and an outer antenna element 142B disposed to surround a periphery of the inner antenna element 142A. Each of the antenna elements 142A and 142B is formed in a spiral coil shape and made of a conductor, e.g., copper, aluminum, stainless steel or the like.

The antenna elements 142A and 142B are formed as one unit by a plurality of clamping bodies 144. As shown in FIG. 2, for example, each of the clamping or fixing bodies 144 is formed in a rod shape, and the clamping bodies 144 are arranged radially so as to protrude from the vicinity of the central portion of the inner antenna element 142A to the outside of the outer antenna element 142B. FIG. 2 shows a specific example in which the antenna elements 142A and 142B are clamped by the three clamping bodies 144.

The shield member 160 of the present embodiment includes a cylindrical inner shield wall 162A formed between the antenna elements 142A and 142B to surround the inner antenna element 142A and a cylindrical outer shield wall 162B formed to surround the outer antenna element 142B. Accordingly, the upper surface of the plate-shaped dielectric member 104 is divided into a central portion (central zone) located inside the inner shield wall 162A and an edge portion (edge zone) disposed between the shield walls 162A and 162B.

A circular plate-shaped inner shield plate 164A is provided above the inner antenna element 142A so as to cover the opening of the inner shield wall 162A. A doughnut-shaped outer shield plate 164b is provided on the outer antenna element 142B so as to cover the opening between the shield walls 162A and 162B.

The shape of the shield member 160 is not limited to a cylindrical shape, and may be another shape, e.g., a square columnar shape or the like. However, it is preferred to have a shape same as that of the processing chamber 102. For example, in the present invention, the processing chamber 102 is formed in a substantially cylindrical shape, so that the shield member 160 is also formed in a substantially cylindrical shape. Further, when the processing chamber 102 is formed in a substantially square columnar shape, it is preferable to form the shield member 160 in a substantially square columnar shape.

The antenna elements 142A and 142B are connected to high frequency power supplies 150A and 150B, respectively. Therefore, the high frequency power of a same frequency or different frequencies can be applied to the antenna elements 142A and 142B. For example, when a high frequency power of a predetermined frequency (e.g., 40 MHz) is supplied at a predetermined power level from the high frequency power supply 150A to the inner antenna element 142A, the processing gas introduced into the processing chamber 102 is excited by an induction field generated in the processing chamber 102. Accordingly, a doughnut-shaped plasma is generated at the central portion of the wafer W.

Further, when a high frequency power of a predetermined frequency (e.g., 60 MHz) is supplied at a predetermined power level from the high frequency power supply 150B to the outer antenna element 142B, the processing gas introduced into the processing chamber 102 is excited by an induction field generated in the processing chamber 102. As a consequence, another doughnut-shaped plasma is generated at the edge portion of the wafer W.

By using the plasma thus generated, a predetermined plasma processing such as ashing, etching, film formation or the like is performed on the wafer. The high frequencies outputted from the high frequency power supplies 150A and 150B are not limited to the aforementioned frequencies, and various frequencies, e.g., 13.56 MHz, 27 MHz, 40 MHz, 60 MHz and the like, can also be supplied therefrom. The electrical lengths of the antenna elements 142A and 142B need to be controlled in accordance with the high frequencies outputted from the high frequency power supplies 150A and 150B.

Specific configurations of the antenna elements 142A and 142B will be described in detail later. The heights of the inner shield plate 164A and the outer shield plate 164B can be controlled by the actuators 168A and 168B, respectively. The detailed description thereof will be provided later.

The plasma processing apparatus 100 is connected to a control unit (entire control unit) 200, and each unit of the plasma processing apparatus 100 is controlled by the control unit 200. Further, the control unit 200 is connected to a manipulation unit 210 having a keyboard to which an operator inputs commands to manage the plasma processing apparatus 100, a display for visually displaying the operation status of the plasma processing apparatus 100 and the like.

Moreover, the control unit 200 is connected to a storage unit 220 which stores therein programs for implementing various processes executed by the plasma processing apparatus 100 under the control of the control unit 200, recipe data for performing the programs, and the like.

The storage unit 220 stores therein, in addition to a plurality of processing recipes for executing processes of the wafer W, recipes and the like for executing required processes such as cleaning and the like in the processing chamber 102. These recipes include a plurality of parameters such as control parameters for controlling various units of the plasma processing apparatus 100, setting parameters and the like. For example, the processing recipes include parameters such as a flow rate ratio of the processing gas, a pressure in the processing chamber 102, a power or a frequency of a high frequency power applied to each of the antenna elements 142A and 142B.

The recipes may be stored in a hard disk or a semiconductor memory, or may be set in a predetermined position of the storage unit 220 while being stored in a portable storage medium such as a CD-ROM, a DVD or the like.

When each unit is controlled by the control unit 200 in accordance with a required processing recipe retrieved from the storage unit 220 based on instructions from the manipulation unit 210, a desired processing in the plasma processing apparatus 100 is performed. The recipes can be edited by operating the manipulation unit 210.

(Configuration Example of High Frequency Antenna)

Hereinafter, a specific configuration example of the high frequency antenna 140 in accordance with the present embodiment will be described with reference to the drawings. For example, as shown in FIG. 2, each of the antenna elements 142A and 142B of the high frequency antenna 140 is configured to generate a standing wave of ½ wavelength, wherein both ends a and b of each of the antenna elements 142A and 142B are free or open ends (i.e., not grounded and not bound to the ground potential) and each of the antenna elements 142A and 142B is grounded (i.e., at the grounded potential) at a central point of a length along a winding direction or a point close thereto (hereinafter, simply referred to as "central point").

A length, a winding diameter, a winding pitch and the number of turns of the inner antenna element 142A are set so that the inner antenna element 142A resonates at ½ wavelength of a reference frequency (e.g., 40 MHz) supplied from the high frequency power supply 150A (a half wavelength mode). For example, an electrical length of the inner antenna element 142A is a length that allows the inner antenna element 142A to resonate at a wavelength of the reference frequency multiplied by ½, that is, the length corresponding to ½ of the wavelength of the reference frequency.

Further, a length, a winding diameter, a winding pitch and the number of turns of the outer antenna element 142B are set so that the outer antenna element 142B resonates at ½ wavelength of a reference frequency (e.g., 60 MHz) supplied from the high frequency power supply 150B (in a half wavelength mode). For example, an electrical length of the outer antenna element 142B is a length that allows the outer antenna element 142B to resonate at a wavelength of the reference frequency multiplied by ½, that is, the length corresponding to ½ of the wavelength of the reference frequency.

Moreover, the antenna elements 142A and 142B may be formed in any shape, e.g., a pipe shape, a line shape, a plate shape or the like. If the winding pitches of the antenna elements 142A and 142B are the same, the case where a distance between conductors is large is advantageous in view of increasing a withstanding voltage. A large distance between conductors can be obtained when each of the antenna elements 142A and 142B has a plate shape having a small width instead of a pipe shape having a thick width. Therefore, the plate shape is preferable in view of a withstanding voltage. Further, even when further reduction in the winding pitches of the antenna elements 142A and 142B is required, the plate shape is preferable in view of a withstanding voltage.

In that case, a power supply point for supplying a high frequency power from each of the high frequency power supplies 150A and 150B may be positioned either at an inner side or at an outer side of the ground points. Preferably, the power supply point may be at position where an impedance is ensured to be 50Ω. Further, the power supply point may be varied, and in this case, a motor or the like can be used to automatically change the power supply point.

Figure 3:
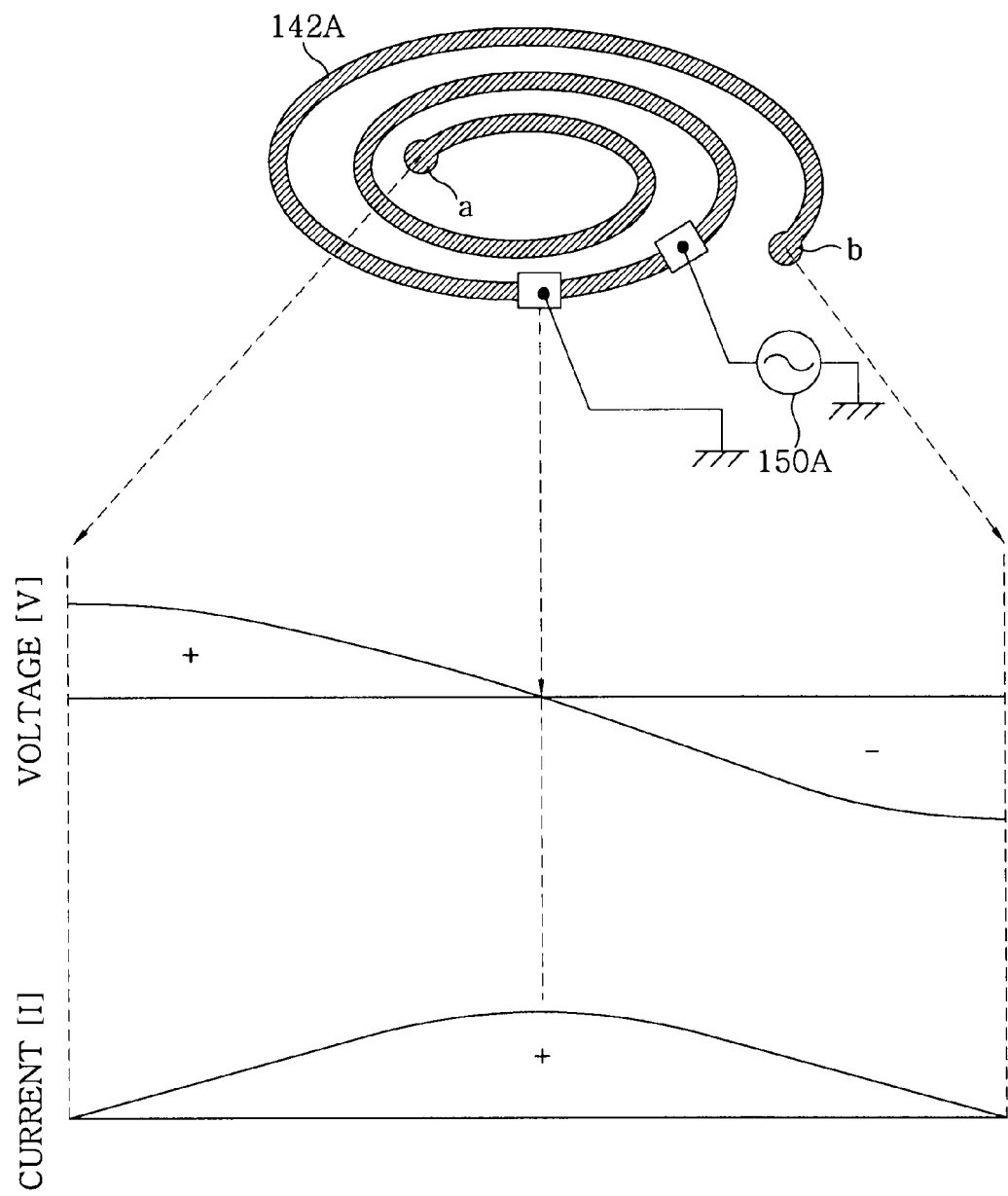
FIG. 3 schematically describes a current and a voltage applied in the case of having an inner antenna element grounded at a central point thereof to resonate.
Figure 4:
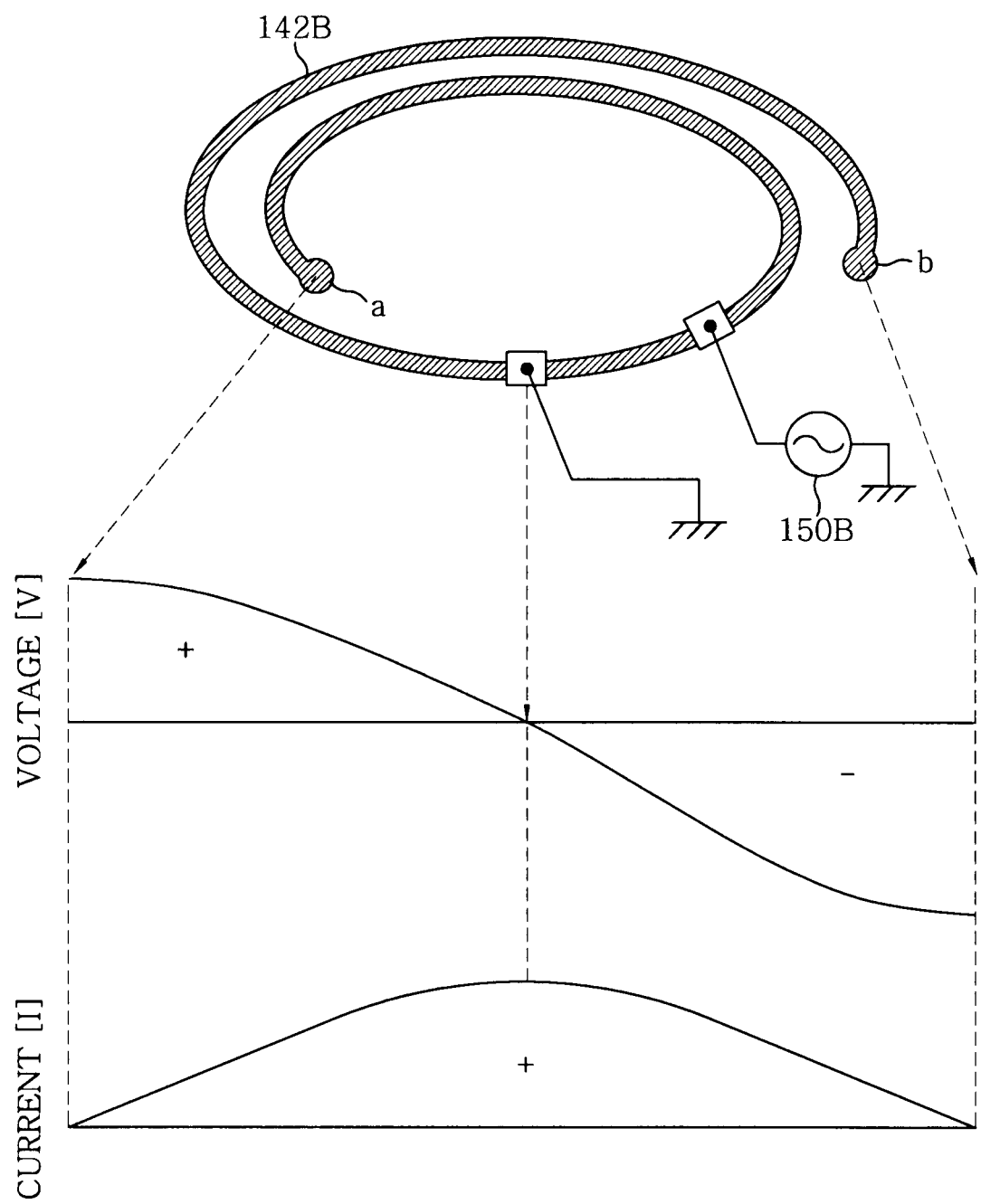
FIG. 4 schematically depicts a current and a voltage applied in the case of having an outer antenna element grounded at a central point thereof to resonate.

The following is description of an operation of the high frequency antenna 140 of the present embodiment. The antenna elements 142A and 142B are made to resonate in a half wavelength mode by applying high frequency powers of reference frequencies from the high frequency power supplies 150A and 150B thereto. As shown in FIGS. 3 and 4, a voltage V applied to each of the antenna elements 142A and 142B has a waveform in which zero occurs at the central point (ground point); a positive peak occurs at one of the ends a and b; and a negative peak occurs at the other of the ends a and b. Meanwhile, a current I applied to each of the antenna elements 142A and 142B has a waveform shifted by 90 degree in phase from the waveform of the voltage, so that zero occurs at the both ends a and b and a peak occurs at the central point (ground point).

Figure 5:
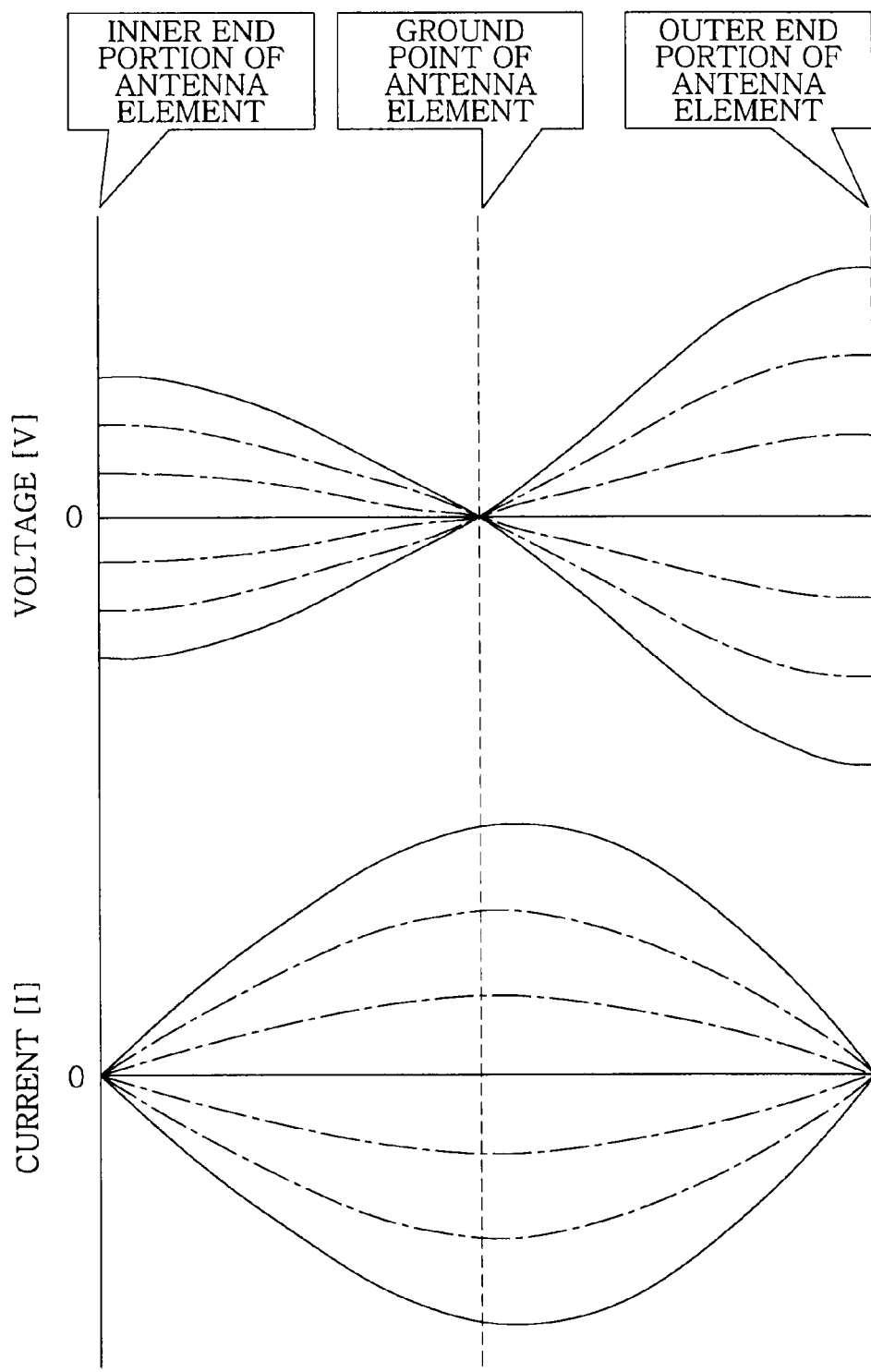
FIG. 5 shows a current and a voltage actually applied to the inner antenna element or the outer antenna element.

Further, the voltage and the current momentarily increases or decreases in opposite directions at each of positive and negative cycles of the high frequency wave, so that the voltages V and the currents I applied to the antenna elements 142A and 142B have waveforms shown in FIG. 5, for example. In other words, in the case of the voltage V, the positive and the negative voltage component in the antenna elements 142A and 142B cancel each other, so that the standing wave in the half wavelength mode is generated with a very small average voltage. On the other hand, in the case of the current I, the peak occurs at the central point (ground point) of each of the antenna elements 142A and 142B, and the standing wave is generated by the positive and the negative current component.

Figure 6:
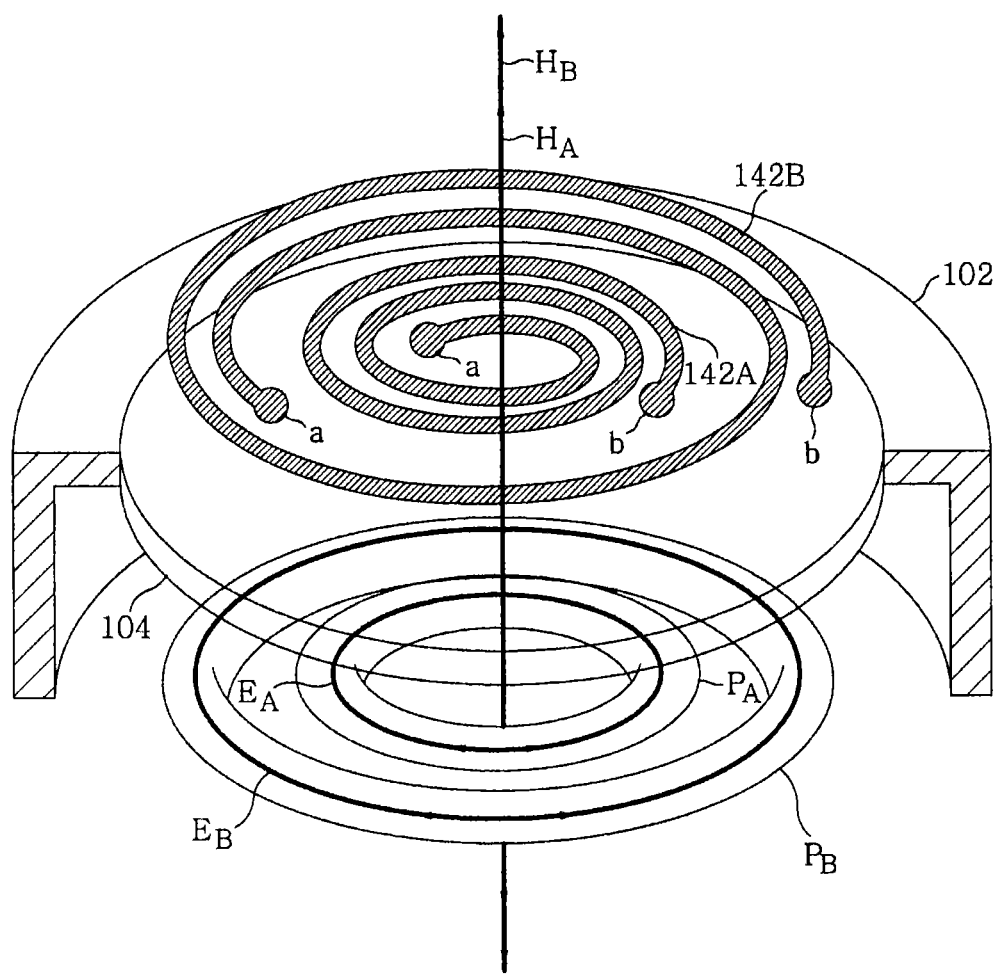
FIG. 6 is a perspective view for explaining operations of the antenna elements in accordance with this embodiment.

Due to the standing waves, vertical magnetic fields $H_A$ and $H_B$ having maximum intensity at the substantially central portions of the spiral coils forming the antenna elements 142A and 142B are generated as shown in FIG. 6. Accordingly, circular electrical fields $E_A$ and $E_B$ generated around the vertical magnetic fields $H_A$ and $H_B$ are excited on the substantially same plane in the processing chamber 102. As a consequence, doughnut-shaped plasmas $P_A$ and $P_B$ are generated around the region below the ground points of the antenna elements 142A and 142B. Further, the average voltages applied to the antenna elements 142A and 142B are very low. Hence, the capacitance coupling is extremely small, which makes it possible to generate plasmas having low potentials.

Figure 7:
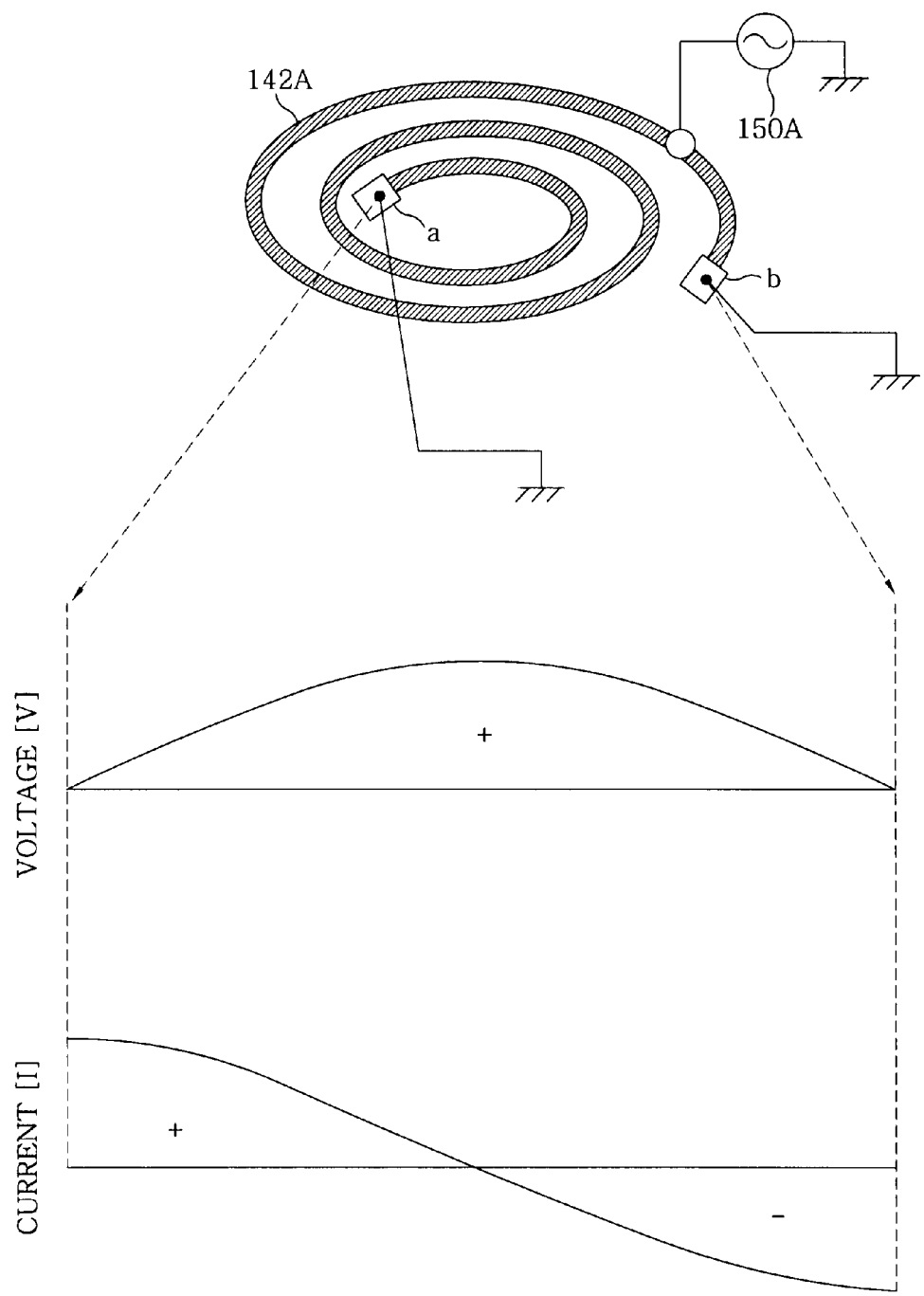
FIG. 7 shows a comparative example which schematically depicts a current and a voltage applied in the case of having an inner antenna element grounded at an end thereof to resonate.

A comparative example in which the ground point of the inner antenna element 142A is changed will now be described in comparison with the embodiment of the present invention. FIG. 7 shows the comparative example illustrating the case where an inner end a and an outer end b of the inner antenna element 142A are grounded. This case is compared with the case where the central portion of the inner antenna element 142A is grounded (FIG. 3).

If the high frequency power supply 150A is connected to a portion other than the inner end a and the outer end b of the inner antenna element 142A in a state where the inner end a and the outer end b of the inner antenna element 142A are grounded as shown in FIG. 7, the waveforms of the voltage V and the current I become the opposite to those shown in FIG. 3. That is, when the inner antenna element 142A is made to resonate in the half wavelength mode by applying the high frequency power of the reference frequency from the high frequency power supply 150A thereto, the voltage V applied to the inner antenna element 142A has a waveform in which a peak occurs at the central point and zero occurs at the both ends a and b. On the other hand, the waveform of the current I applied to the inner antenna element 142A is shifted by 90 degrees in phase from the waveform of the voltage, so that zero occurs at the central point and a positive peak occurs at one of the ends a and b and a negative peak occurs at the other of the ends a and b.

When the inner antenna element 142A having both ends a and b grounded (FIG. 7) is made to resonate in the half wavelength mode as in the case of the inner antenna element 142A grounded at the central point thereof (FIG. 3), magnetic fields of two opposite directions are generated all the time at the inner side and the outer side of the inner antenna element 142A which are divided by the central point of the length in the winding direction (see the waveform of the current I shown in FIG. 7). In other words, two circular electric fields are excited by the inner antenna element 142A in the processing chamber 102. Although the rotation directions of these two circular electric fields are alternately reversed at half of the period of the high frequency wave applied to the inner antenna element 142A, the rotation directions are always opposite to each other. Therefore, the two circular electric fields interfere with each other, and a plasma generated at this time may become unstable.

Meanwhile, when the central point of the inner antenna element 142A is grounded (FIG. 3), a single circular electric field is excited by the inner antenna element 142A in the processing chamber 102. Therefore, a more stable plasma can be generated when the central point of the inner antenna element 142A is grounded compared to when both ends a and b of the inner antenna element 142A are grounded.

Moreover, when both ends a and b of the inner antenna element 142A are grounded (FIG. 7), voltage components remain in the inner antenna element 142A in the resonant state, so that a large amount of capacitively coupled components are generated in the plasma. On the other hand, when the central point of the inner antenna element 142A is grounded (FIG. 3), the amount of voltage components remaining in the inner antenna element 142A in a resonant state is very small, so that capacitively coupled components are hardly generated in the plasma. Therefore, in order to perform processing which causes less damage, it is preferable to allow the central point of the inner antenna element 142A to be grounded (FIG. 3).

In order to reduce the amount of capacitance coupling components in the plasma, it is preferable to reduce the amount of voltage components remaining in the inner antenna element 142A. Therefore, when both ends a and b of the inner antenna element 142A are grounded (FIG. 7), the capacitively coupled components in the plasma can be reduced by using an antenna element having a low inductance. However, when the antenna element having a low inductance is used, the excited magnetic field becomes weak, and this makes it difficult to generate an intense inductively coupled plasma.

On the other hand, when the central point of the inner antenna element 142A is grounded (FIG. 3), it is not required to reduce the amount of capacitively coupled components in the plasma, so that an antenna element having a high inductance can be used. When the antenna element having a high inductance is used, a high magnetic field can be generated, and this makes it possible to form an intense inductively coupled plasma. Hence, in order to generate a high-density plasma, it is preferable to allow the central point of the inner antenna element 142A to be grounded (FIG. 3).

Although only the inner antenna element 142A has been described, the outer antenna element 142B shown in FIG. 4 is the same as the inner antenna element 142A in that the central point thereof is grounded. In other words, a single circular electric field is excited in the processing chamber 102 by the outer antenna element 142B. Therefore, a stable plasma can be generated when the central point of the outer antenna element 142B is grounded compared to when both ends thereof are grounded.

In the high frequency antenna 140 in accordance with the embodiment of the present invention, each of the antenna elements 142A and 142B, which has the free ends a and b and is grounded at the central point of a length in a winding direction, is made to resonate in a ½ wavelength mode. Accordingly, a stable high-density plasma having a low plasma potential can be easily generated.

In the present embodiment, in order to make the antenna elements 142A and 142B resonate in the ½ wavelength mode, each of the electrical lengths of the antenna elements 142A and 142B needs to be accurately ½ of the wavelength of the reference frequency. In other words, it is required to accurately set the resonant frequencies of the antenna elements 142A and 142B.

However, it is difficult to obtain accurate physical lengths of the antenna elements 142A and 142B. Further, the resonant frequencies of the antenna elements 142A and 142B are affected by their intrinsic reactances as well as by the stray capacitances $C_A$ and $C_B$ between the antenna elements 142A and 142B and the shield plates 164A and 164B shown in FIG. 8. Thus, even if the accurate physical lengths of the antenna elements 142A and 142B can be obtained, the distances between the antenna elements 142A and 142B and the shield plates 164A and 164B may have an error due to an installation error or the like. Accordingly, designed resonant frequencies may not be realized.

When the both ends of the inner antenna element 142A are the ground points as shown in FIG. 7, the electrical length of the inner antenna element 142A can be adjusted by installing a variable capacitor at the ground point. However, when the central point of the inner antenna element 142A is the grounded point as shown in FIG. 3, installing a variable capacitor between the central point of the inner antenna element 142A and the ground increases the loss caused by the capacitor and thus is not advantageous. In case of connecting the variable capacitor therebetween, it is unlikely to satisfy matching conditions of the high frequency power supply 150A if the capacitance C of the capacitor is small. On the contrary, if the capacitance C is large, a high current flows in the variable capacitor, which may lead to breakdown thereof.

Thus, in the present embodiment, the distances between the antenna elements 142A and 142B and the shield plates 164A and 164B can be controlled by adjusting the heights of the shield plates 164A and 164B. As a consequence, the stray capacitances $C_A$ and $C_B$ can vary, and the resonant frequencies of the antenna elements 142A and 142B can be controlled individually. Besides, in the present embodiment, the distances between the plasmas and the antenna elements 142A and 142B can be controlled by adjusting the height of the high frequency antenna 140, and this enables the plasma potential to be controlled.

Figure 8:
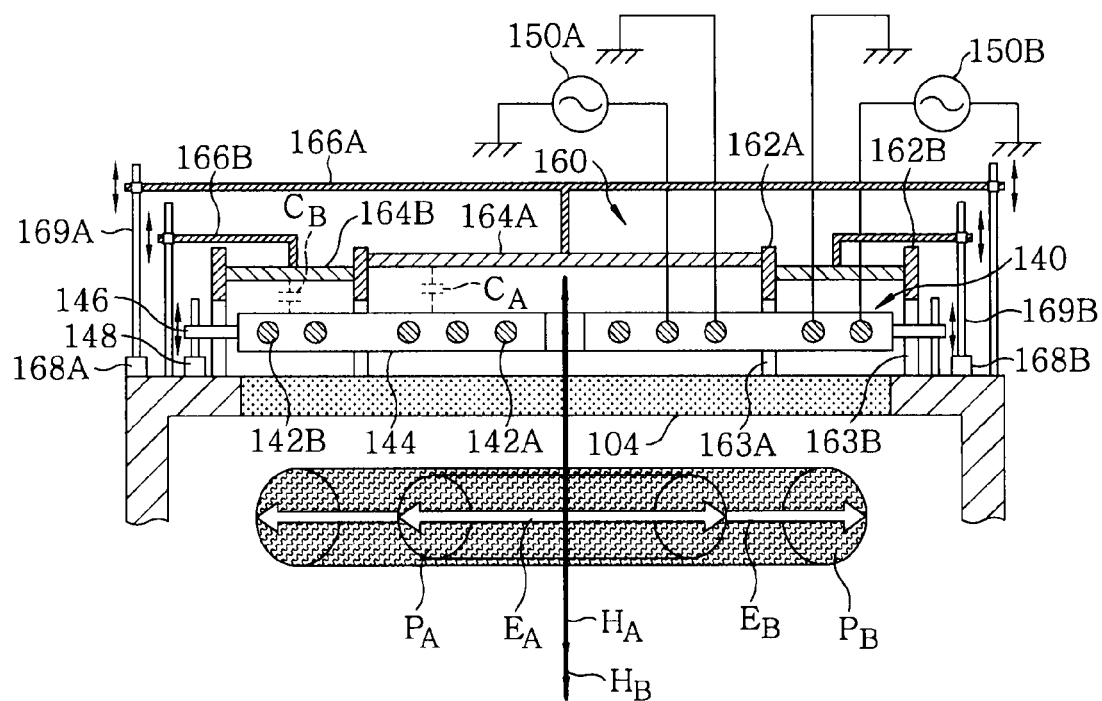
FIG. 8 presents a partial cross sectional view for explaining a height adjusting mechanism for the antenna and shield plates.
Figure 9A:
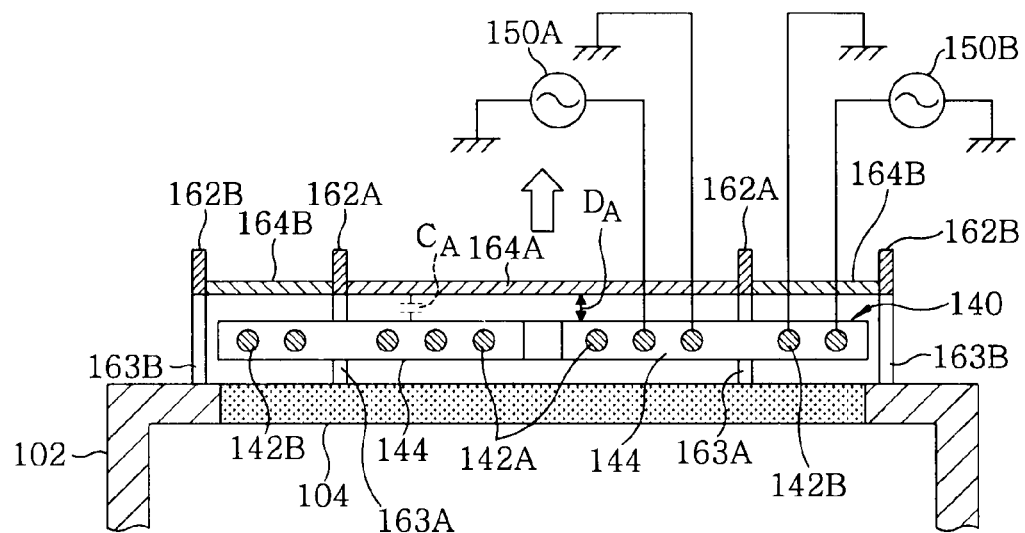
FIG. 9A explains an operation of a height adjusting mechanism for an inner shield plate.
Figure 9B:
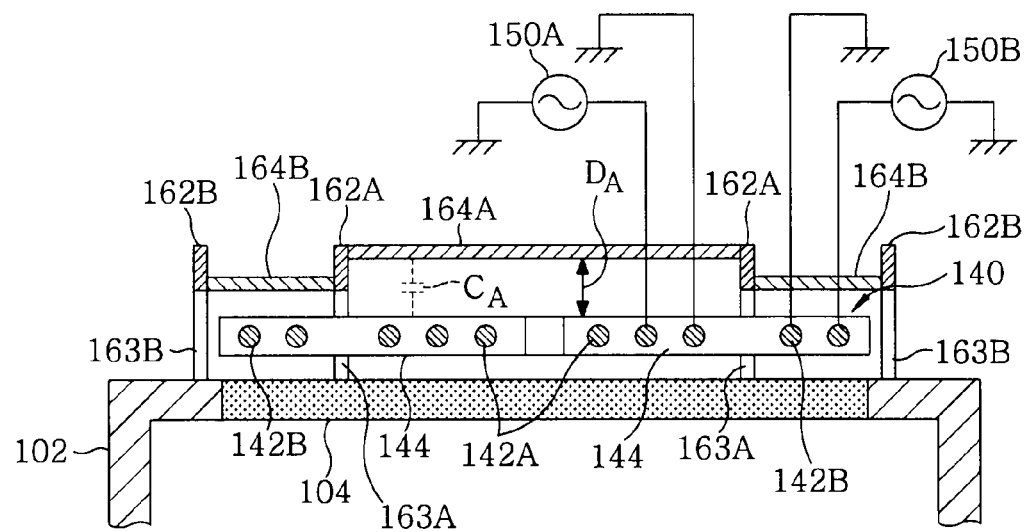
FIG. 9B explains an operation of the height adjusting mechanism for the inner shield plate.

Hereinafter, the height adjusting mechanisms for the shield plates 164A and 164B and the high frequency antenna 140 will be described in detail with reference to the drawings. FIG. 8 is an enlarged view of the vicinity of the high frequency antenna 140 shown in FIG. 1. FIGS. 9A and 9B explain an operation for adjusting a height of the inner shield plate 164A. FIG. 9A shows the case where the height of the inner shield plate 164A is reduced, and FIG. 9B illustrates the case where the height of the inner shield plate 164A is increased.

Figure 10A:
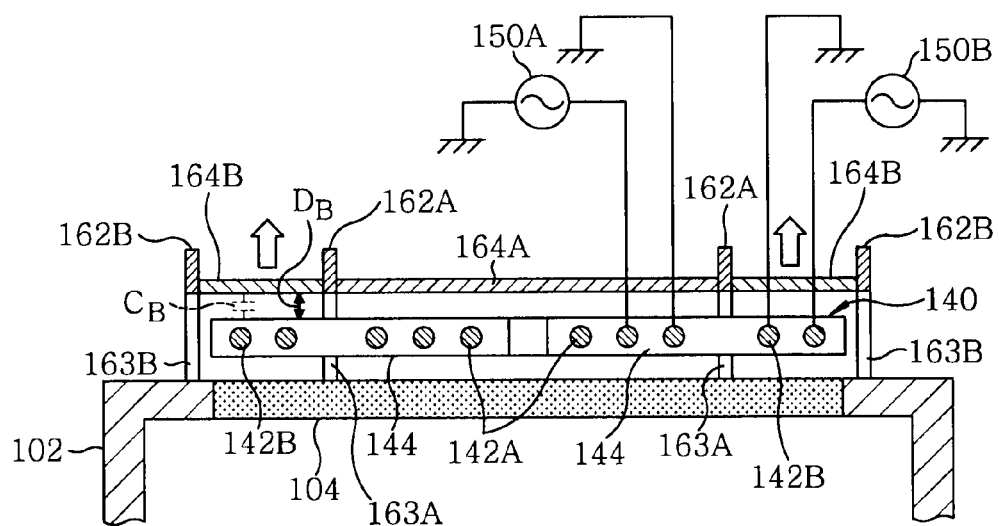
FIG. 10A explains an operation of a height adjusting mechanism for an outer shield plate.
Figure 10B:
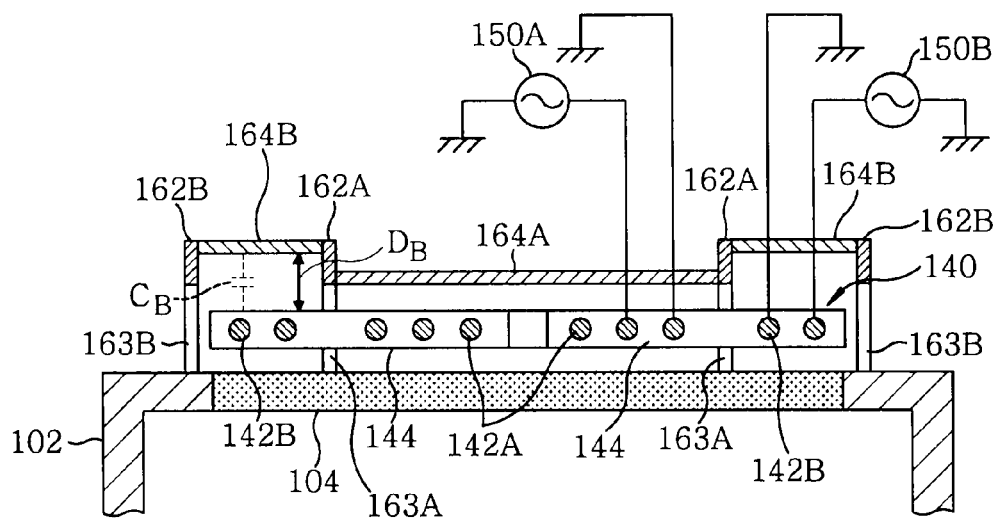
FIG. 10B explains an operation of the height adjusting mechanism for the outer shield plate.
Figure 11A:
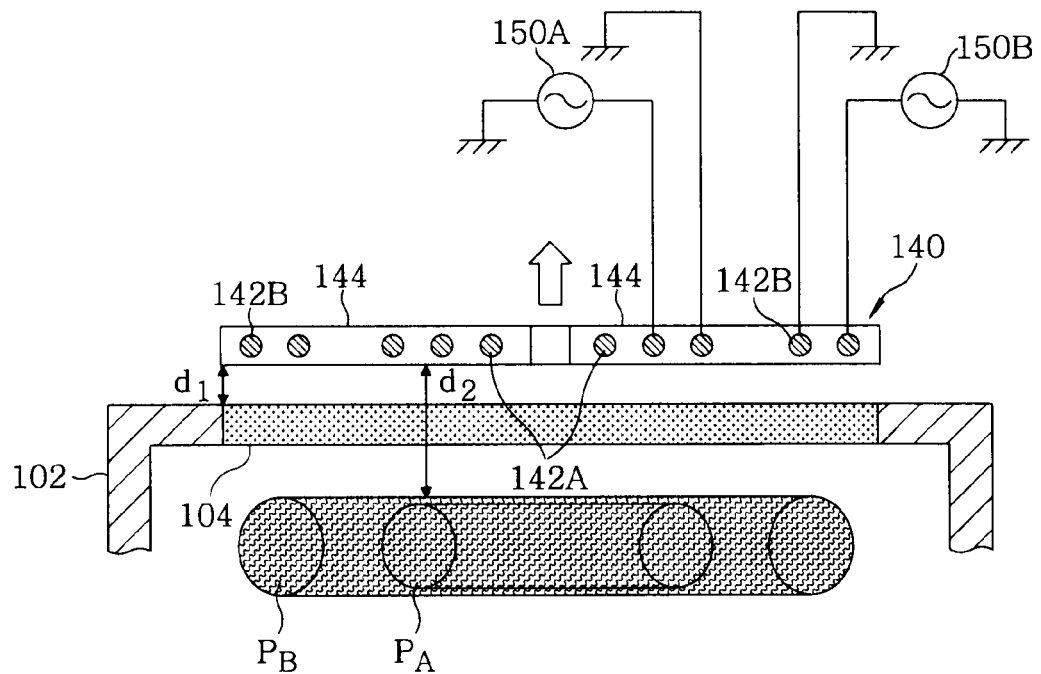
FIG. 11A explains an operation of a height adjusting mechanism for a high frequency antenna.
Figure 11B:
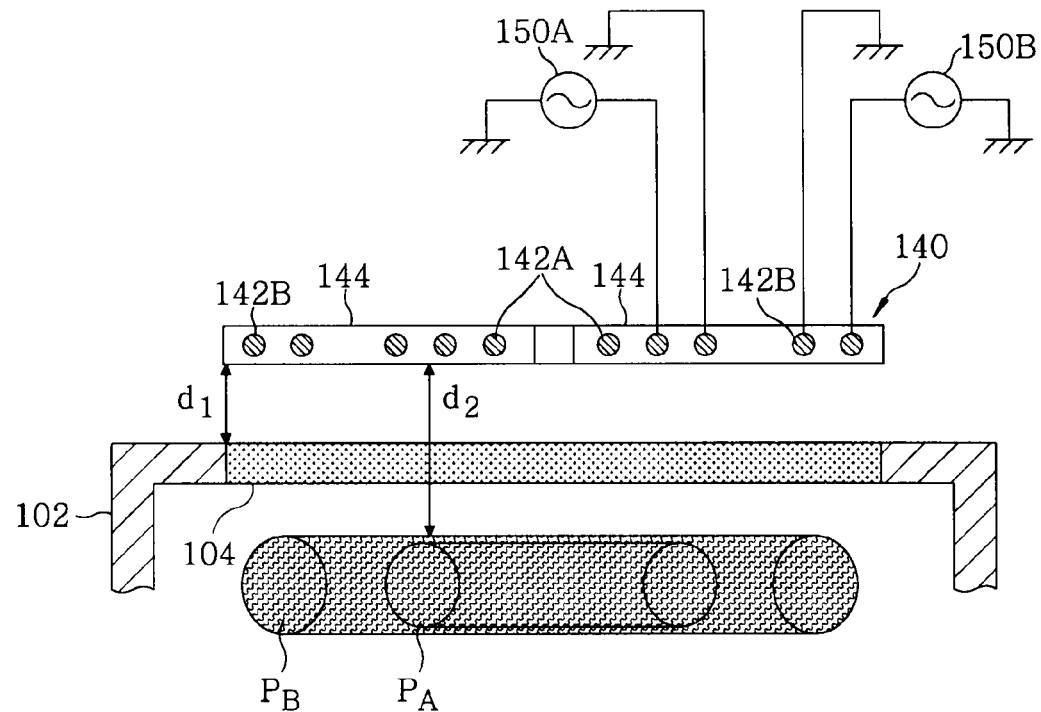
FIG. 11B explains an operation of the height adjusting mechanism for the high frequency antenna.

FIGS. 10A and 10B explain operations for adjusting a height of an outer shield plate 164B. FIG. 10A shows the case where the height of the outer shield plate 164B is reduced, and FIG. 10B depicts the case where the height of the outer shield plate 164B is increased. FIGS. 11A and 11B explain operations for adjusting a height of the high frequency antenna 140. FIG. 11A describes the case where the height of the high frequency antenna 140 is reduced, and FIG. 11B shows the case where the height of the high frequency antenna 140 is increased.

First, a specific configuration example of the shield height adjusting mechanism will be explained. As illustrated in FIG. 8, the inner shield plate 164A slides vertically along an inner shield wall 162A by an actuator 168A provided at the processing chamber 102. For example, the inner shield plate 164A is suspended by a support body 166A capable of sliding vertically. Further, the actuator 168A includes, e.g., a motor capable of vertically moving a driving rod 169A, and the inner shield plate 164A suspended by the support body 166A is vertically moved by the driving rod 169A. Preferably, the inner shield plate 164A slides while being in contact with an inner periphery of the inner shield wall 162A.

Further, the outer shield plate 164B slides vertically between the inner shield wall 162A and the outer shield wall 162B by an actuator 168B provided at the processing chamber 102. For example, the outer shield plate 164B is suspended by a support body 166B capable of sliding vertically. The actuator 168B includes, e.g., a motor capable of vertically moving a driving rod 169B, and the outer shield plate 164B suspended by the support body 166B is vertically moved by the driving rod 169B. Preferably, the outer shield plate 164B slides while being in contact with an inner periphery of the outer shield wall 162B and an outer periphery of the inner shield wall 162A.

Each of the support bodies 166A and 166B includes, e.g., a horizontal support plate and a suspension member protruding from a bottom portion of the support plate. The top surfaces of the shield plates 164A and 164B are fixed to a lower end of the suspension member.

By vertically moving the shield plates 164A and 164B by the actuators 168A and 168B, the distances $D_A$ and $D_B$ between the shield plates 164A and 164B and the antenna elements 142A and 142B can be controlled individually.

To be specific, in order to adjust the height of the inner shield plate 164A, the inner shield plate 164A is moved from a position shown in FIG. 9A to a position shown in FIG. 9B by driving the actuator 168A, so that the distance $D_A$ between the inner shield plate 164A and the inner antenna element 142A increases. This decreases the stray capacitance $C_A$, so that the resonant frequency can be controlled to match with the increased electrical length of the inner antenna element 142A.

On the contrary, the distance $D_A$ between the inner shield plate 164A and the inner antenna element 142A can be decreased by lowering the inner shield plate 164A. This increases the stray capacitance $C_A$, so that the resonant frequency can be controlled to match with the decreased electrical length of the inner antenna element 142A.

Further, in order to adjust the height of the outer shield plate 164B, the outer shield plate 164B is moved from a position shown in FIG. 10A to a position shown in FIG. 10B by driving the actuator 168B, so that the distance $D_B$ between the outer shield plate 164B and the outer antenna element 142B increases. This decreases the stray capacitance $C_B$, so that the resonant frequency can be controlled to match with the increased electrical length of the outer antenna element 142B.

On the contrary, the distance $D_B$ between the outer shield plate 164B and the outer antenna element 142B can be reduced by lowering the outer shield plate 164B. This increases the stray capacitance $C_B$, so that the resonant frequency can be controlled to match with the decreased electrical length of the outer antenna element 142B.

The height adjusting mechanism for the shield plates 164A and 164B is not limited to the above-described example. For example, each of the actuators 168A and 168B may be provided in plural numbers. Besides, it is unnecessary to provide the actuators 168A and 168B, and the shield plates 164A and 164B can be manually raised and lowered.

That is, in accordance with the present embodiment, the stray capacitances $C_A$ and $C_B$ between the antenna elements 142A and 142B and the shield plates 164A and 164B can be changed by adjusting the heights of the shield plates 164A and 164B. Thus, the resonant frequencies of the antenna elements 142A and 142B can be controlled without changing physical lengths of the antenna elements 142A and 142B.

Further, only by adjusting the heights of the shield plates 164A and 164B, the resonant frequencies of the antenna elements can be easily controlled such that they can be made to resonate at desired frequencies, respectively. When the antenna element formed of a spiral coil-shaped copper pipe having a maximum outer diameter of 320 mm and a winding pitch of 20 mm, for example, was made to resonate at ½ of wavelength of 27.12 MHz, the resonant frequency was able to be controlled within about +5% to ±10% simply by adjusting the height of the shield member 160 between about 10 mm and 100 mm.

Since the electrical lengths of the antenna elements 142A and 142B can be adjusted by controlling the stray capacitances $C_A$ and $C_B$ between the antenna elements 142A and 142B and the shield plates 164A and 164B, a degree of freedom in size, shape or the like of the antenna elements 142A and 142B can be greatly increased. In other words, in the plasma processing apparatus 100 of the present embodiment, antenna elements of various sizes and shapes can be used. For example, an antenna element may have an elliptic shape or the like other than a square shape.

The increase in degree of freedom in size, shape or the like of the antenna elements 142A and 142B can allow a freedom such that an antenna element can be designed in accordance with a required plasma size. For example, a size and a shape of each of the antenna elements 142A and 142B can be freely designed in accordance with a diameter of the wafer W. Moreover, the degree of freedom in a plasma size can be greatly increased by optimizing a winding pitch and a resonant frequency of each of the antenna elements.

Since the heights of the shield plates 164A and 164B can be adjusted, when the heights of the shield plates 164A and 164B are too low so that the distance between the antenna elements 142A and 142B is too small, a dielectric member can be inserted between the shield plates 164A and 164B and the antenna elements 142A and 142B to prevent abnormal discharge.

The following is a description of a specific configuration example of the antenna height adjusting mechanism. As shown in FIG. 8, the antenna elements 142A and 142B of the high frequency antenna 140 are configured to slide vertically by an actuator 148 installed at the processing chamber 102. For example, protrusions 146, which can be slidingly moved in a vertical direction, are provided at the clamping bodies 144 to protrude to the outside thereof. In that case, the protrusions 146 protrude outwardly from vertically extending slit-shaped openings 163B formed at the outer shield wall 162B. Further, the actuator 148 includes, e.g., a motor capable of vertically moving a driving rod 149. When the protrusions 146 are vertically moved by the driving rod 149, the antenna elements 142A and 142B supported by the clamping bodies 144 are vertically moved.

The height adjusting mechanism for the high frequency antenna 140 is not limited to the above. For example, a plurality of actuators 148 may be provided. Further, it is unnecessary to provide the actuator 148, and the high frequency antenna 140 can be manually raised and lowered.

In accordance with the height adjusting mechanism for the high frequency antenna 140, a distance $d_1$ between the high frequency antenna 140 and the plate-shaped dielectric member 104 and, further, a distance $d_2$ between the antenna elements 142A and 142B and the plasmas $P_A$ and $P_B$ can be adjusted by vertically moving the high frequency antenna 140 by the driving rod 149 of the actuator 148.

To be specific, the distance $d_2$ between the antenna elements 142A and 142B and the plasmas $P_A$ and $P_B$ is increased by raising the high frequency antenna 140 from a position shown in FIG. 11A to a position shown in FIG. 11B by driving the actuator 148. Accordingly, the capacitance coupling between the plasmas $P_A$ and $P_B$ generated in the processing chamber 102 and the voltage components in the antenna elements 142A and 142 can be reduced, and this can decrease potentials of the plasmas $P_A$ and $P_B$.

On the contrary, the distance $d_2$ between the antenna elements 142A and 142B and the plasmas $P_A$ and $P_B$ can be reduced by lowering the high frequency antenna 140. Accordingly, the capacitance coupling degree between the plasmas $P_A$ and $P_B$ generated in the processing chamber 102 and the voltage components in the antenna elements 142A and 142B can be increased, and this can increase potentials of the plasmas $P_A$ and $P_B$.

In accordance with the present embodiment, the plasma potential can be controlled by changing the distance $d_2$ between the antenna elements 142A and 142B and the plasmas $P_A$ and $P_B$ by adjusting the height of the high frequency antenna 140. That is, the plasma potential can be easily controlled simply by adjusting the height of the high frequency antenna 140. For example, in the plasma processing which requires a high-potential plasma, the distance $d_2$ between the antenna elements 142A and 142B and the plasmas $P_A$ and $P_B$ is shortened by decreasing the height of the high frequency antenna 140.

Moreover, the distance $d_1$ between the high frequency antenna 140 and the plate-shaped dielectric member 104 can be controlled to be smaller than or equal to 3 cm, and is preferably made to be controllable to vary between 3 cm and 5 cm. In accordance with the high frequency antenna 140 of the present embodiment, a plasma can be generated extremely effectively. Thus, a plasma can be generated even when the distance $d_1$ between the high frequency antenna 140 and the plate-shaped dielectric member 104 is greater than or equal to 4 cm.

Each of the antenna elements 142A and 142B of the present embodiment has a planar spiral coil, so that a diameter thereof gradually increases from an inner end a toward an outer end b on the same plane. Therefore, when the central points of the antenna elements 142A and 142B are grounded, lines formed from the inner ends a to the ground point and lines formed from the ground point to the outer ends b have different reactances, so that the waveforms of the voltages V shown in FIG. 5 (FIGS. 3 and 4) are not exactly symmetrical but slightly different between the inner lines and the outer lines divided by the central points of the antenna elements 142A and 142B. Hence, voltage components remain to be non-zero in the antenna elements 142A and 142B.

In accordance with the present embodiment, the plasma potential can be reduced to almost practically negligible level by adjusting the height of the high frequency antenna 140 to increase the distance between the antenna elements 142A and 142B and the plasmas $P_A$ and $P_B$. For that reason, the plasma can be generated without being affected by the voltage components which may slightly remain in the antenna elements 142A and 142B.

The heights of the high frequency antenna 140 and the shield plates 164A and 164B can be respectively controlled by controlling the actuators 148, 168A and 168B under the control of the control unit 200. In that case, the heights of the high frequency antenna 140 and the shield plates 164A and 164B can be controlled by an operator's manipulation through the manipulation unit 210 or by automatic control of the control unit 200.

To be specific, when the heights of the shield plates 164A and 164B are automatically adjusted, the resonant frequencies of the antenna elements 142A and 142B can be automatically controlled by adjusting the heights of the shield plates 164A and 164B by controlling the actuators 168A and 168B in accordance with high frequency powers detected by high frequency power meters (e.g., reflection wave power meters) (not shown) (so as to minimize reflection wave powers), the high frequency power meters being provided at output sides of the high frequency power supplies 150A and 150B. Hence, the resonant frequencies of the antenna elements 142A and 142B can be automatically optimized in accordance with desired output frequencies of the high frequency power supplies 150A and 150B.

The antenna height adjusting mechanism shown in FIG. 8 is configured to vertically move the antenna elements 142A and 142B together. However, it can also be configured to vertically move the antenna elements 142A and 142B individually.

(Modification of High Frequency Antenna)

Figure 12:
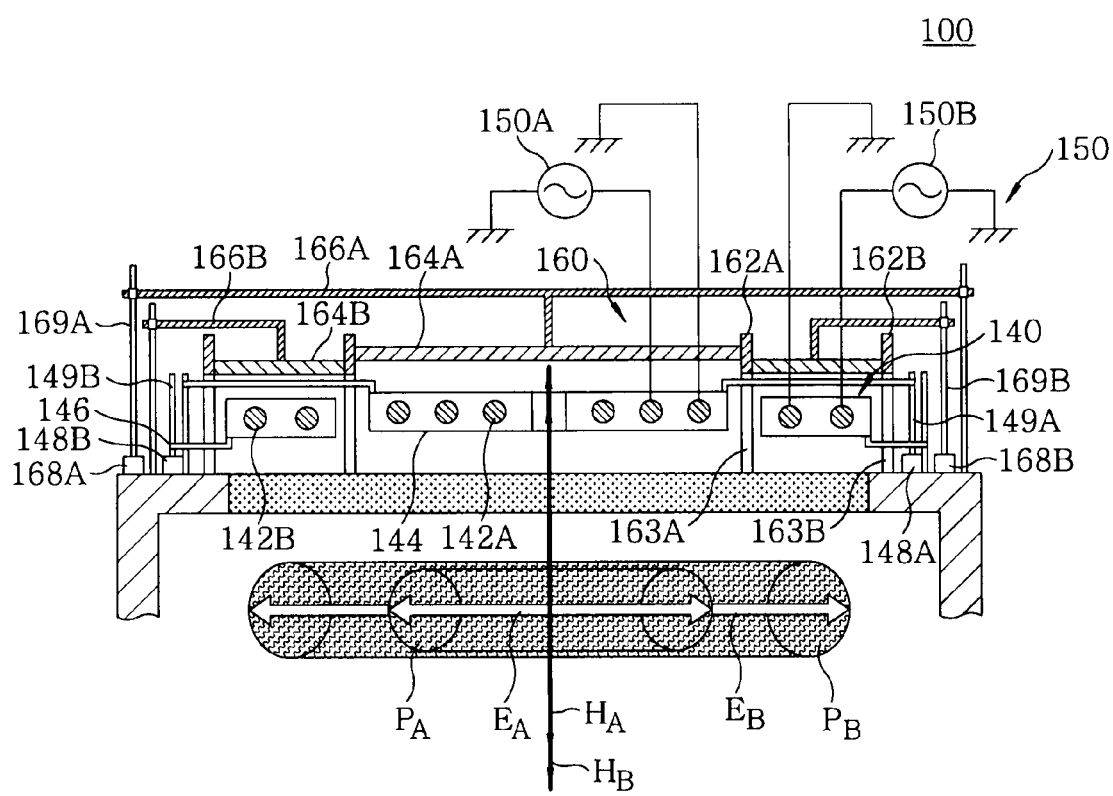
FIG. 12 describes a partial cross sectional view of a modification of the high frequency antenna.
Figure 13:
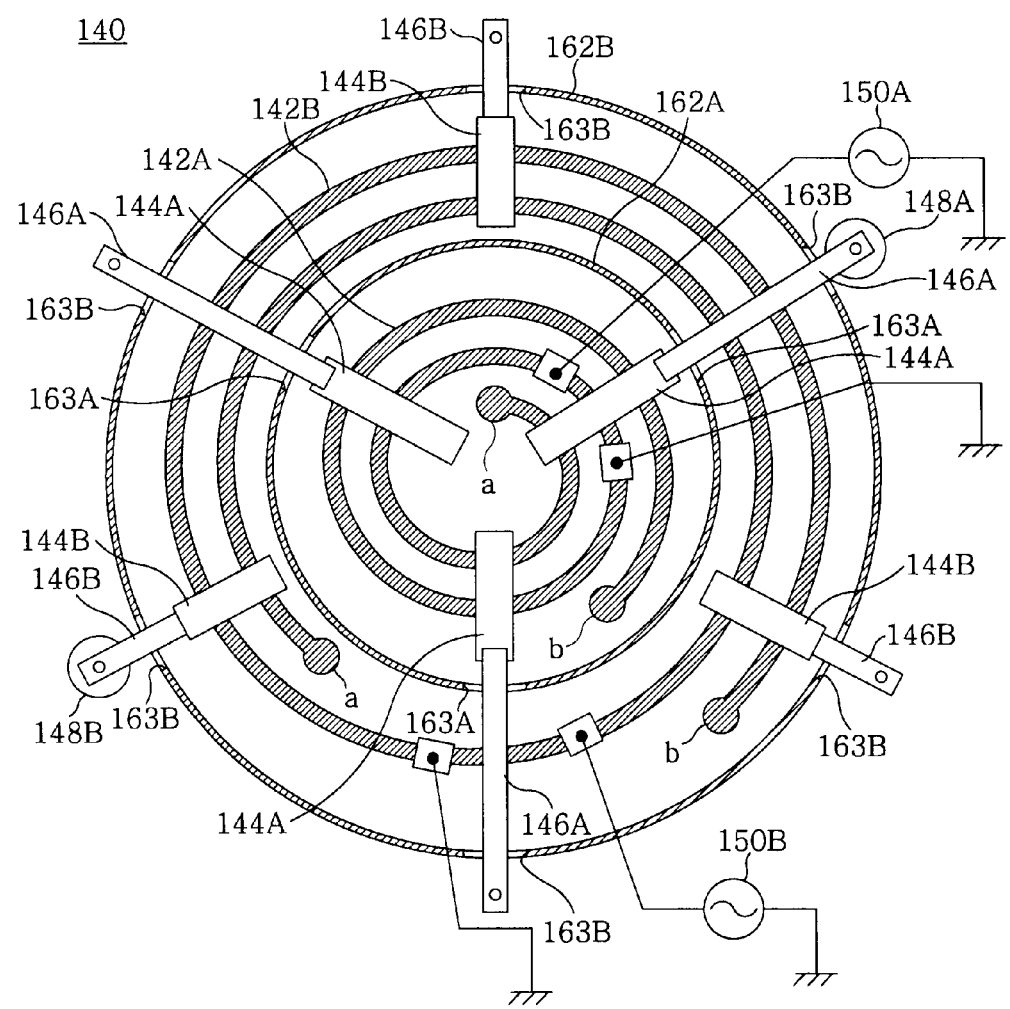
FIG. 13 shows a top view of a high frequency antenna shown in FIG. 12.

Hereinafter, a modification of the high frequency antenna 140 will be described with reference to the drawings. FIG. 12 is a partial cross sectional view showing a modification of the high frequency antenna 140, and FIG. 13 is a top view of the high frequency antenna 140 shown in FIG. 12. Herein, an antenna height adjusting mechanism for supporting and vertically moving the antenna elements 142A and 142B individually will be described as an example.

As shown in FIGS. 12 and 13, the antenna elements 142A and 142B are supported by the clamping bodies 144A and 144B, respectively. Preferably, the clamping bodies 144A and 144B are arranged radially as shown in FIG. 13 in order to save space and miniaturize the apparatus.

The antenna elements 142A and 142B are configured to slide vertically by the actuators 148A and 148B installed at the processing chamber 102, respectively. Further, protrusions 146A and 146B, which can be slidingly moved in a vertical direction, are provided at the clamping bodies 144A and 144B to protrude to the outside thereof. In that case, the protrusion 146A protrudes outward from vertically extending slit-shaped openings 163A and 163B respectively formed at shield walls 162A and 162B, and the protrusion 146B protrudes outwardly from a slit-shaped opening 163B formed at the outer shield wall 162B.

Further, the actuators 148A and 148B include, e.g., motors capable of vertically moving the driving rods 149A and 149B. When the protrusions 146A and 146B are vertically moved by the driving rods 149A and 149B, the antenna elements 142A and 142B supported respectively by the clamping bodies 144A and 144B are vertically moved independently.

Besides, each of the actuators 148A and 148B may be provided in plural numbers. Further, it is unnecessary to provide the actuators 148A and 148B, and each of the antenna elements 142A and 142B can be manually vertically moved.

Figure 14A:
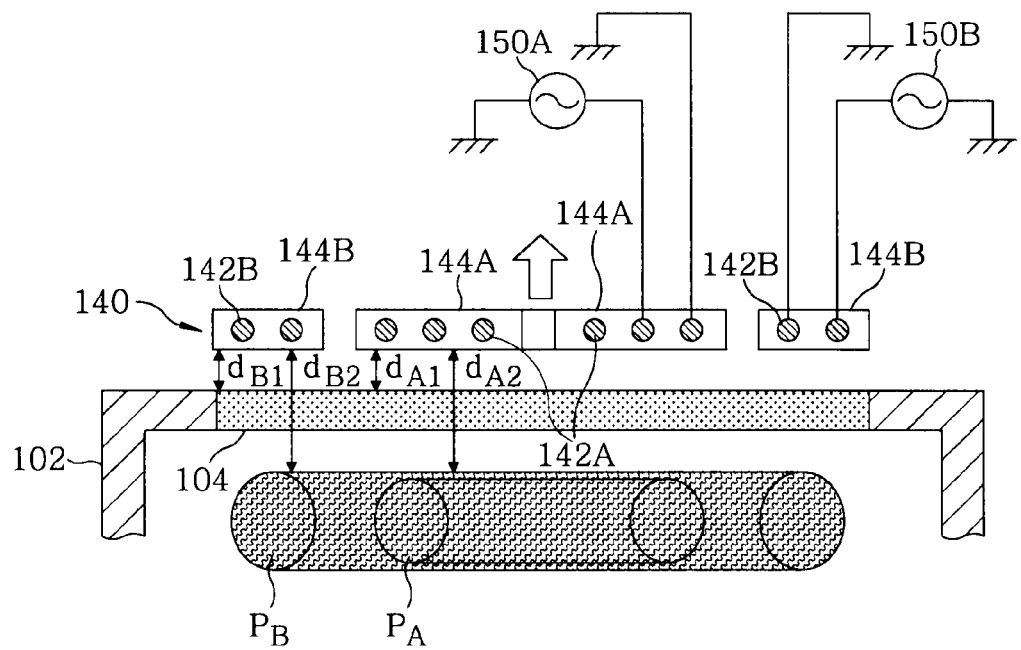
FIG. 14A explains an operation of the height adjusting mechanism for the high frequency antenna shown in FIG. 12.
Figure 14B:
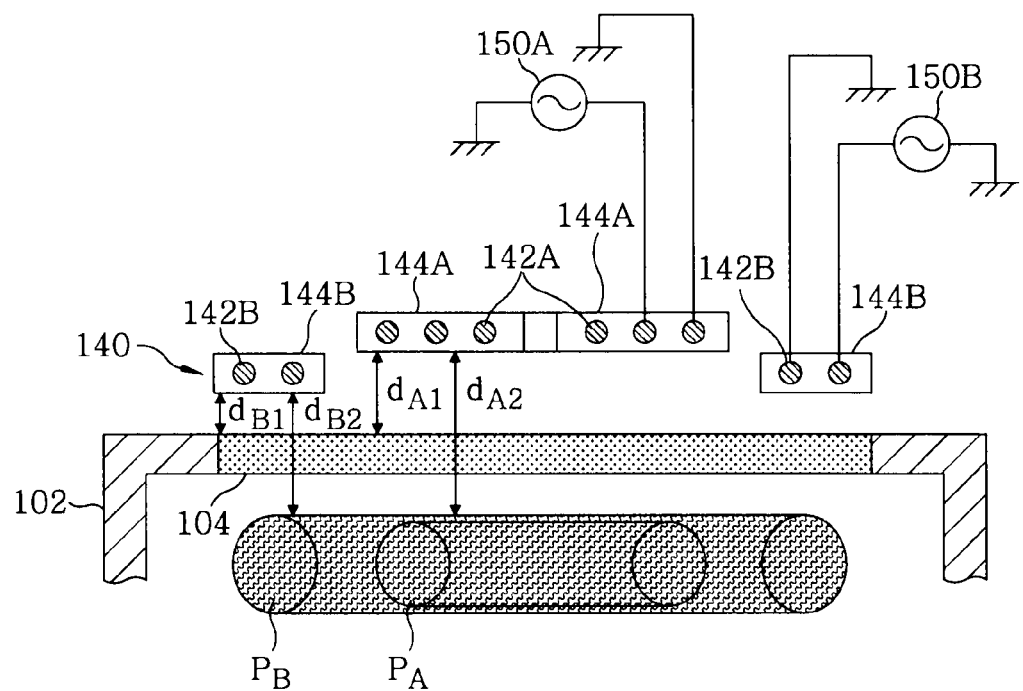
FIG. 14B explains an operation of the height adjusting mechanism for the high frequency antenna shown in FIG. 12.

In accordance with the height adjusting mechanism for the high frequency antenna 140, the antenna elements 142A and 142B are vertically moved by the driving rods 149A and 149B of the actuators 148A and 148B, respectively. Hence, the distances $d_{A1}$ and $d_{B1}$ between the antenna elements 142A and 142B and the plate-shaped dielectric member 104 and, further, the distances $d_{A2}$ and $d_{B2}$ between the antenna elements 142A and 142B and the plasmas $P_A$ and $P_B$ can be adjusted individually as shown in FIGS. 14A and 14B. This can increase or decrease the capacitance coupling between the plasmas $P_A$ and $P_B$ generated in the processing chamber 102 and the voltage components in the antenna elements 142A and 142B, so that the potentials of the plasmas $P_A$ and $P_B$ can be controlled individually.

In the high frequency antenna 140 of the present embodiment, the inner antenna element 142A and the outer antenna element 142B are separately provided. Thus, a plasma $P_A$ generated by the inner antenna element 142A and a plasma $P_B$ generated by the outer antenna elements 142B can be generated at the central portion and the edge portion of the wafer W, respectively. As a result, the in-plane uniformity of the plasma processing of the wafer W can be improved.

Moreover, the high frequency powers of different frequencies can be applied from the high frequency power supplies 150A and 150B to the antenna elements 142A and 142B. By changing powers and/or frequencies of the high frequency powers, densities and/or compositions of the plasmas $P_A$ and $P_B$ can be controlled independently. Therefore, the in-plane uniformity of the plasma processing of the wafer W can be controlled.

By applying the high frequency powers of different frequencies, it is possible to prevent interference of the plasmas $P_A$ and $P_B$, and also possible to change dissociation degree of the processing gas. Accordingly, plasmas having different radical compositions can be stably generated at the central portion and at the edge portion of the wafer W by changing the frequencies of the high frequency powers applied to the antenna elements 142A and 142B.

Figure 15:
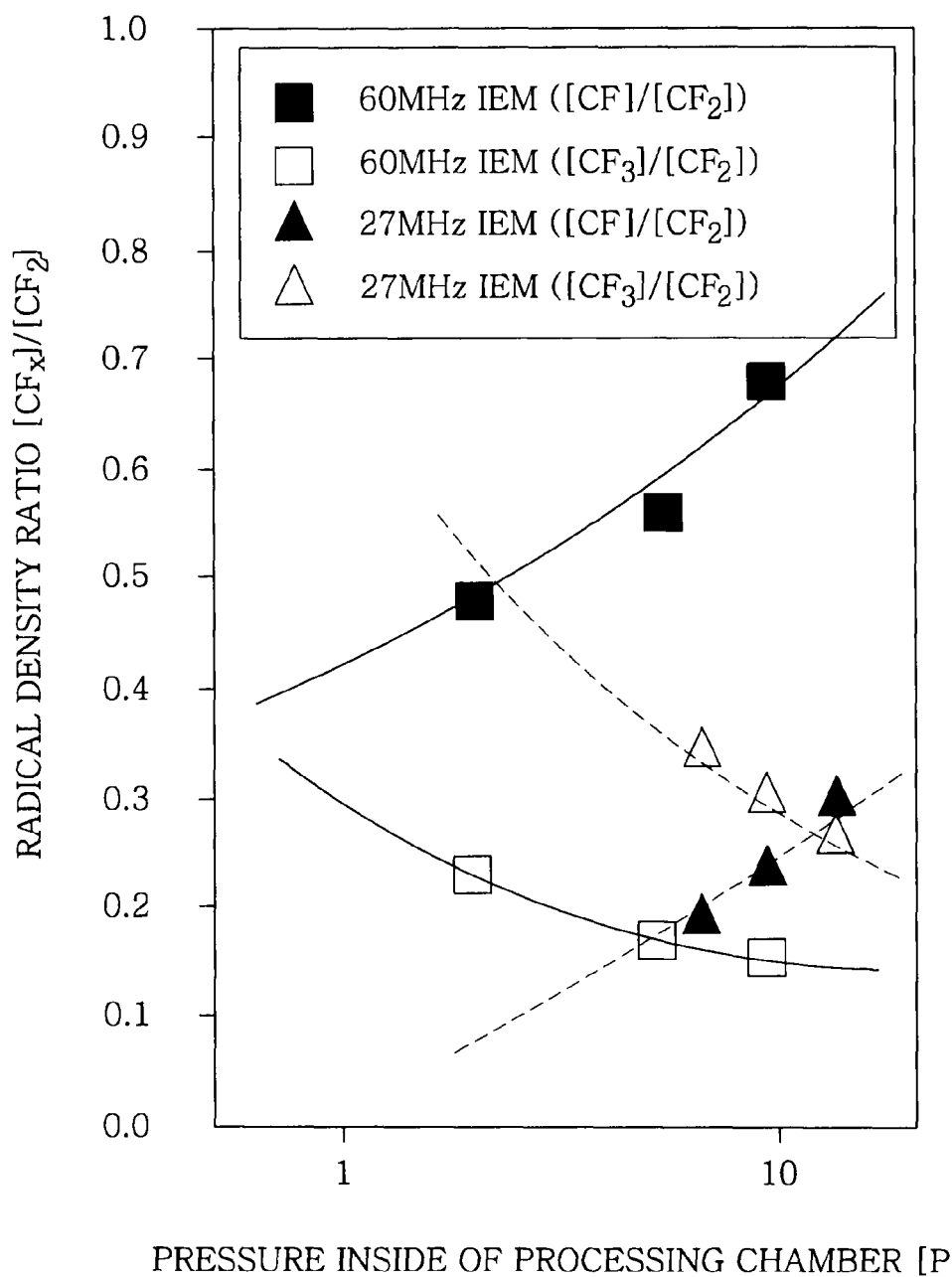
FIG. 15 shows dissociation degrees of a processing gas in the case of applying a high frequency of 27 MHz and that of 60 MHz and offers a graph depicting radical density ratios of predetermined radicals.
Figure 16:
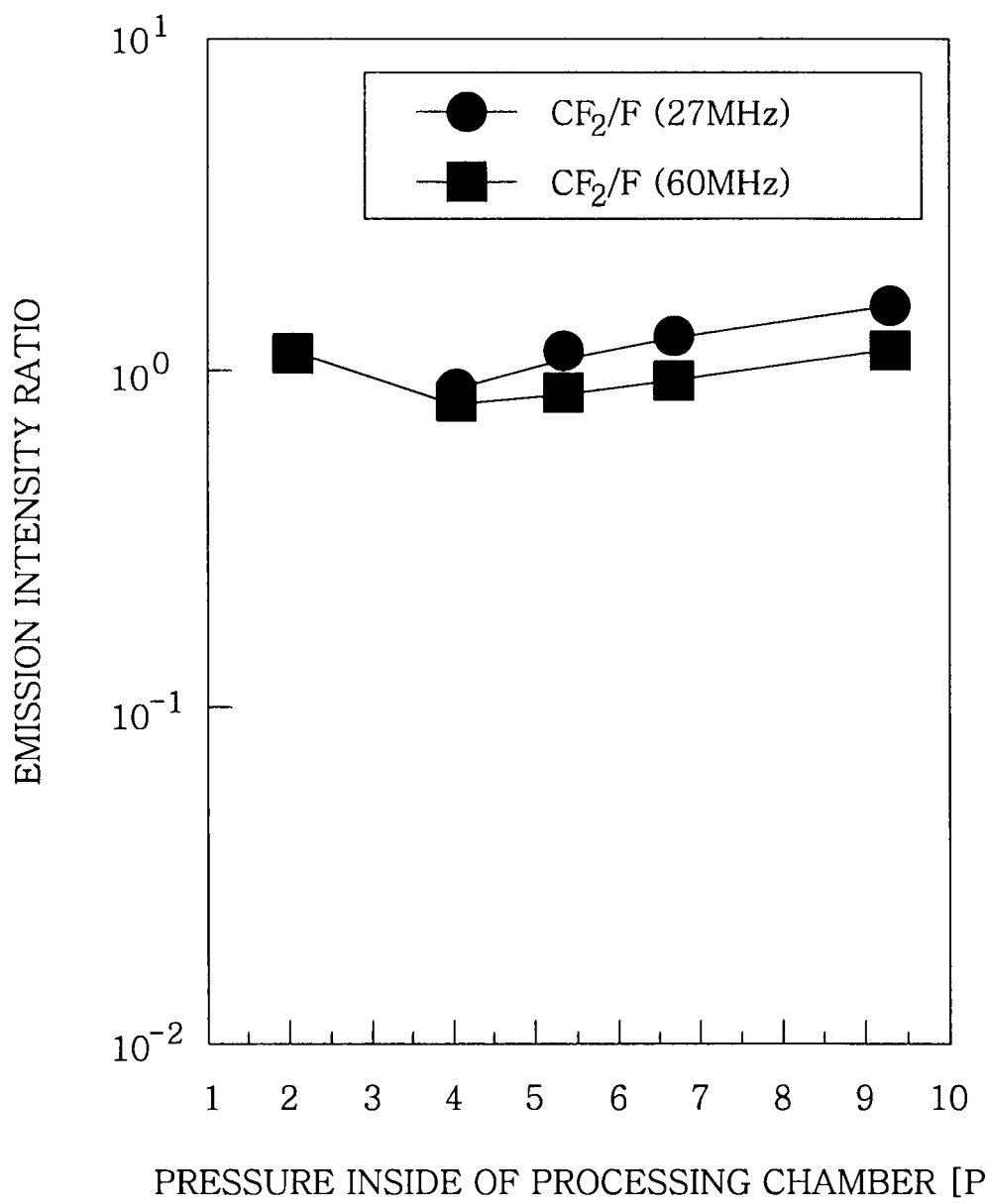
FIG. 16 illustrates dissociation degrees of a processing gas in the case of applying high frequencies of 27 MHz and 60 MHz and presents a graph describing pressure dependence of emission intensity ratios of predetermined radicals.
Figure 17:
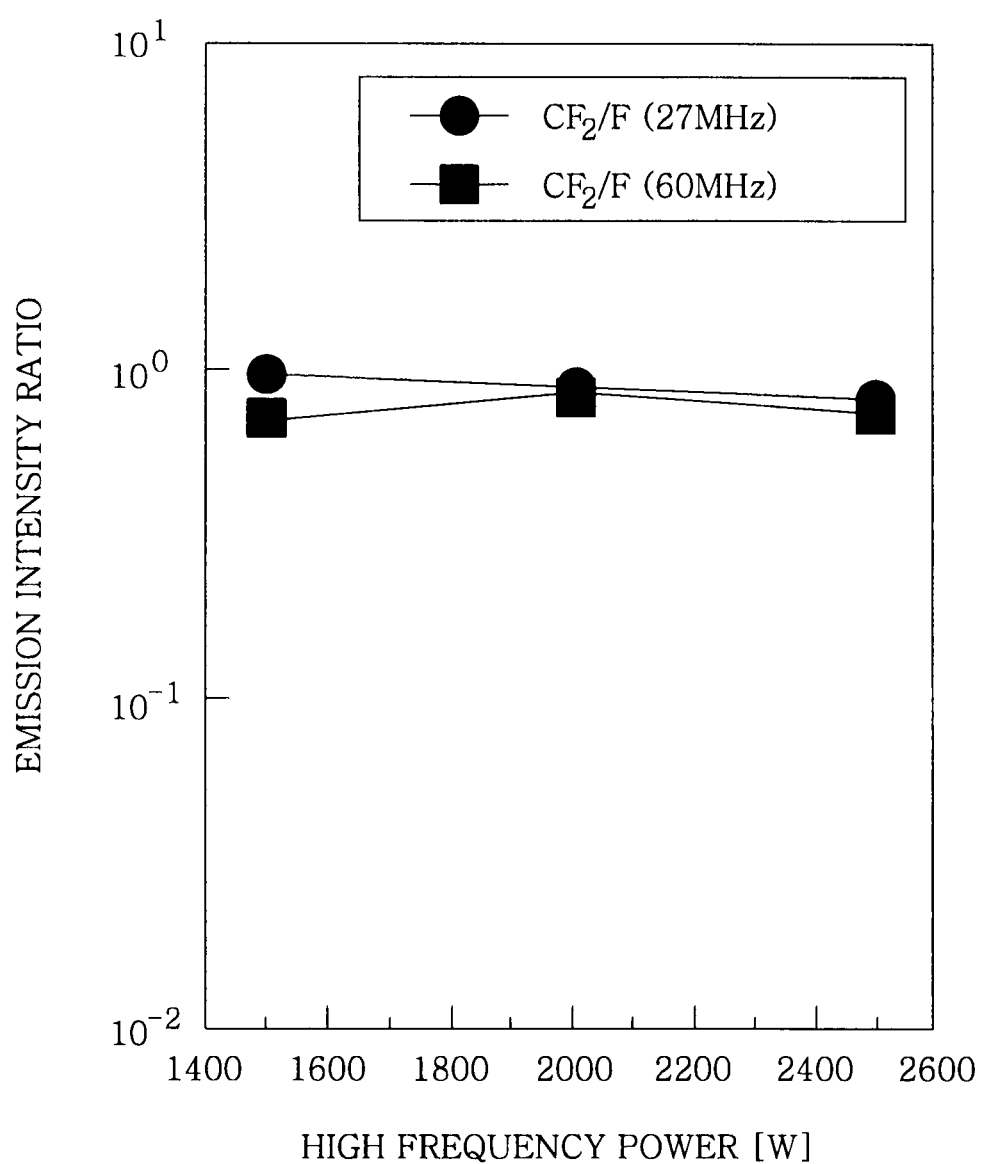
FIG. 17 depicts dissociation degrees of a processing gas in the case of applying high frequencies of 27 MHz and 60 MHz and represents a graph showing high frequency power dependence of emission intensity ratios of predetermined radicals.

FIGS. 15 to 17 show results of the tests measuring the amounts of radicals of $F^*$, $CF^*$, $CF_2^*$ and $CF_3^*$ in case of generating a plasma from a processing gas composed of $C_4F_8$ gas and Ar gas by applying high frequency powers of 27 MHz and 60 MHz from the high frequency power supplies 150A and 150B. FIG. 15 provides a graph showing radical density ratios of $CF^*/CF_2^*$ and $CF_3^*/CF_2^*$ measured by an IRLAS (infrared laser absorption spectroscopy) method while varying a pressure in the processing chamber 102. FIG. 16 offers a graph depicting a radical emission intensity ratio of $CF_2^*/F_2^*$ measured while varying a pressure in the processing chamber 102. FIG. 17 presents a graph describing a radical emission intensity ratio of $CF_2^*/F^*$ measured while varying high frequency powers from the high frequency power supplies 150A and 150B.

Referring to FIG. 15, when the high frequency power having a higher frequency is applied, $CF^*/CF_2^*$ is larger and $CF_3^*/CF_2^*$ is smaller. Moreover, referring to FIGS. 16 and 17, even if the frequencies are different, $CF_2^*/F^*$ are similar. Therefore, $CF_2^*/F^*$ at the edge portion of the wafer W is substantially same as that at the central portion of the wafer W, but the plasma contains larger $CF^*/CF_2^*$ and less $CF_3^*/CF_2^*$ at the edge portion of the wafer W than those at the central portion.

Figure 18:
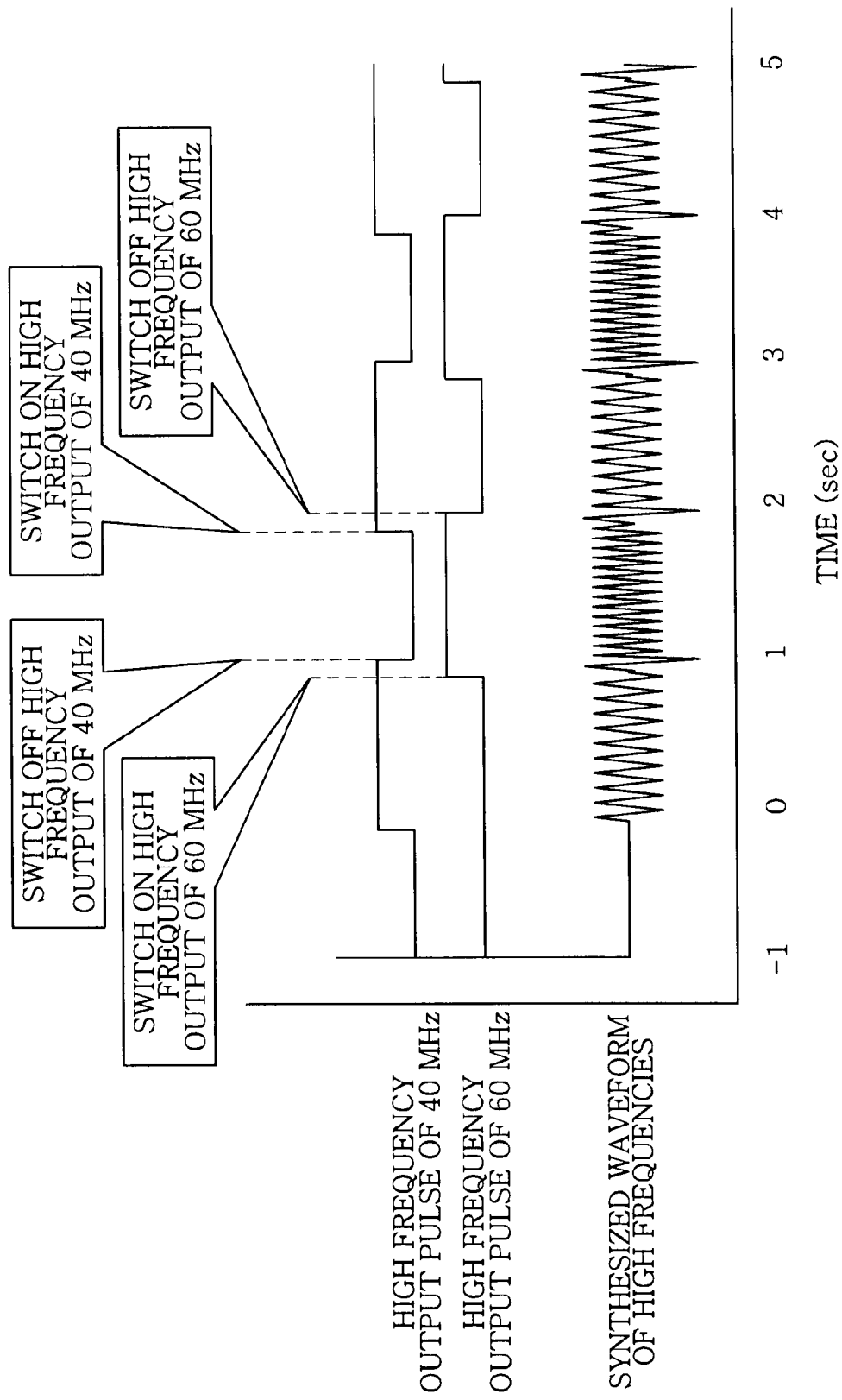
FIG. 18 illustrates pulse waveforms and a synthesized waveform thereof in the case of applying high frequencies of 40 MHz and 60 MHz by a pulse modulation method.

Further, the high frequencies from the high frequency power supplies 150A and 150B can be alternately applied to the antenna elements 142A and 142B at regular intervals by a pulse modulation method. Hence, the plasma can be excited at a low power level. In that case, it is preferable to switch on a high frequency output of one of the high frequency power supplies 150A and 150B right before a high frequency output of the other one of the high frequency power supplies 150A and 150B is switched off. To be specific, FIG. 18 shows pulse waveforms of the high frequency powers of 40 MHz and 60 MHz from the high frequency power supplies 150A and 150B and a synthesized waveform thereof.

Initially, a high frequency output of 40 MHz is switched on. Next, a high frequency output of 60 MHz is switched on at a predetermined period of time later, but before the high frequency output of 40 MHz is switched off. Therefore, when a plasma is initially excited, a plasma $P_A$ generated at the central portion is only excited by the high frequency of 40 MHz, and thereafter, a plasma $P_B$ generated at the edge portion is excited by the high frequency of 60 MHz. Hence, the plasmas can be excited at a power level lower than a power level applied to excite both plasmas simultaneously.

Thereafter, a high frequency output of 40 MHz is switched on right before a high frequency output of 60 MHz is switched off. Then, a high frequency output of 60 MHz is switched on right before a high frequency output of 40 MHz is switched off. By continuing the on-off pulse modulation at such timing, one plasma can be excited before the other plasma disappears. Thus, the plasma can be easily excited at a lower power level, and this enables the plasma to be excited even when a pressure in the processing chamber 102 is lower than or equal to $10^{-4}$ Torr.

Furthermore, in the high frequency antenna 140 of the present embodiment, the resonant frequencies of the antenna elements 142A and 142B can be optimized without using a matching unit. Therefore, when the high frequency outputs from the high frequency power supplies 150A and 150B are controlled by the pulse modulation method, a shorter pulse can be used. Therefore, the high frequency antenna 140 of the present embodiment can be used in a short pulse range (e.g., about several hundreds of Hz or more) where a conventional pulse modulation method using a matching unit cannot be used.

(Modification of Plasma Processing Apparatus)

Figure 19:
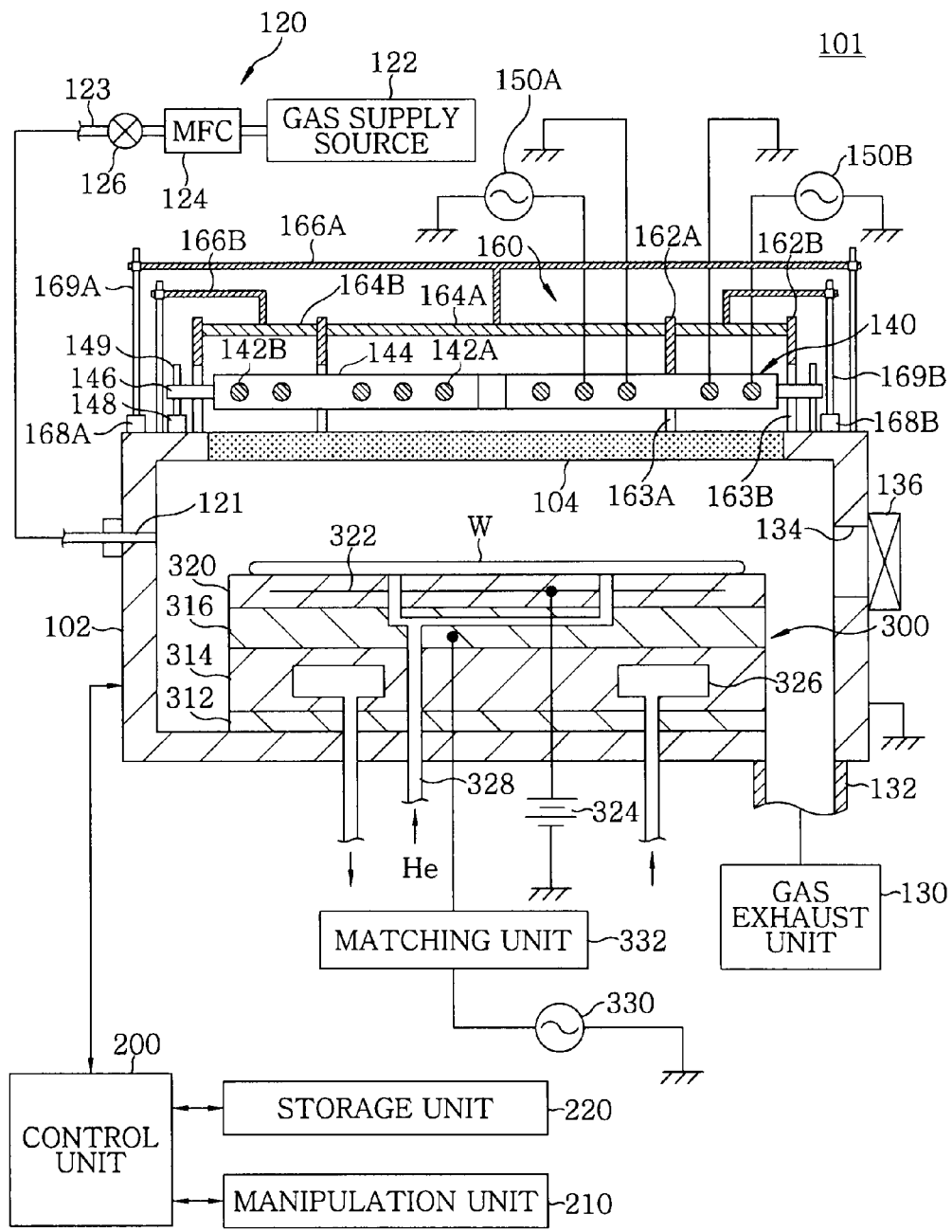
FIG. 19 is a cross sectional view of a modification of the plasma processing apparatus in accordance with the embodiment of the present invention.

Hereinafter, a modification of the plasma processing apparatus of the present embodiment will be described. FIG. 19 schematically shows a modification of the plasma processing apparatus. A plasma processing apparatus 101 shown in FIG. 19 includes, instead of the mounting table 110 shown in FIG. 1, a mounting table 300 having a susceptor capable of applying a bias high frequency power. In the plasma processing apparatus 101 shown in FIG. 19, other configurations except the mounting table 300 are the same as those of the plasma processing apparatus 100, so that detailed description thereof will be omitted.

The mounting table 300 illustrated in FIG. 19 has a cylindrical susceptor support 314 installed at the bottom portion of the processing chamber 102 via an insulating plate 312 made of ceramic or the like and a susceptor 316 provided above the susceptor support 314.

Provided on the top surface of the susceptor 316 is an electrostatic chuck 320 for adsorptively holding the wafer W by electrostatic force. The electrostatic chuck 320 is formed by embedding an electrode made of a conductive film into a pair of insulation layers or insulation sheets, and the electrode 322 is electrically connected to a DC power supply 324. When a DC voltage is applied from the DC power supply 324 to the electrode 322, electrostatic force such as Coulomb force or the like is generated on the top surface of the electrostatic chuck 320, thereby adsorptively holding the wafer W thereon.

A coolant path 326 having, e.g., an annular shape, is formed in the susceptor support 314. A coolant (e.g., cooling water) from a chiller unit (not shown) provided at the outside is supplied into the coolant path 326 and circulates therein. A processing temperature of the wafer W on the susceptor 316 can be controlled by a temperature of the coolant.

In the susceptor support 314, a heat transfer gas (e.g., He gas) from a heat transfer gas supply mechanism (not shown) is supplied to a space between a top surface of the electrostatic chuck 320 and a backside of the wafer W through a heat transfer gas supply line 328.

The susceptor 316 is electrically connected to a high frequency power supply 330 via a matching unit 332. By applying a bias high frequency power from the high frequency power supply 330 to the susceptor 316, ions in the plasma are attracted toward the wafer W. The high frequency power supply 330 outputs a high frequency power (lower high frequency power) having a frequency ranging from 100 kHz to 13.56 MHz, e.g., 13.56 MHz. The high frequency power of the high frequency power supply 330 can vary from, e.g., 50 W to 10000 W.

The matching unit 332 is provided to match a load impedance to an internal (or output) impedance of the high frequency power supply 330, and serves to render the internal impedance of the high frequency power supply 330 and the load impedance to be matched to each other when a plasma is generated in the chamber 102.

When polysilicon on the wafer W is etched by using the plasma processing apparatus 101, a pressure in the processing chamber 102 is adjusted to a predetermined vacuum pressure (e.g., about 3 mTorr, wherein 1 mTorr is equivalent to $(10^{-3} \times 101325/760)$Pa), and a gaseous mixture of HBr gas and $O_2$ gas is supplied as a processing gas into the processing chamber 102. Further, a high frequency power of a predetermined high frequency (e.g., 40 MHz and 300 W) is applied from the high frequency power supply 150A to the inner antenna element 142A; a high frequency power of a predetermined high frequency (e.g., 60 MHz and 700 W) is applied from the high frequency power supply 150B to the outer antenna element 142B; and a high frequency power of a predetermined high frequency (e.g., 13.56 MHz and 100 W) is applied from the high frequency power supply 330 to the susceptor 316.

At this time, each of the antenna elements 142A and 142B grounded at a central point of a length in a winding direction is made to resonate in a ½ wavelength mode, so that plasmas $P_A$ and $P_B$ generated therefrom have extremely low plasma potentials. Accordingly, a self bias voltage applied to the susceptor 316 is hardly changed even if the plasmas $P_A$ and $P_B$ are generated. As a result, highly independent bias control of the susceptor 316 can be performed.

Figure 20:
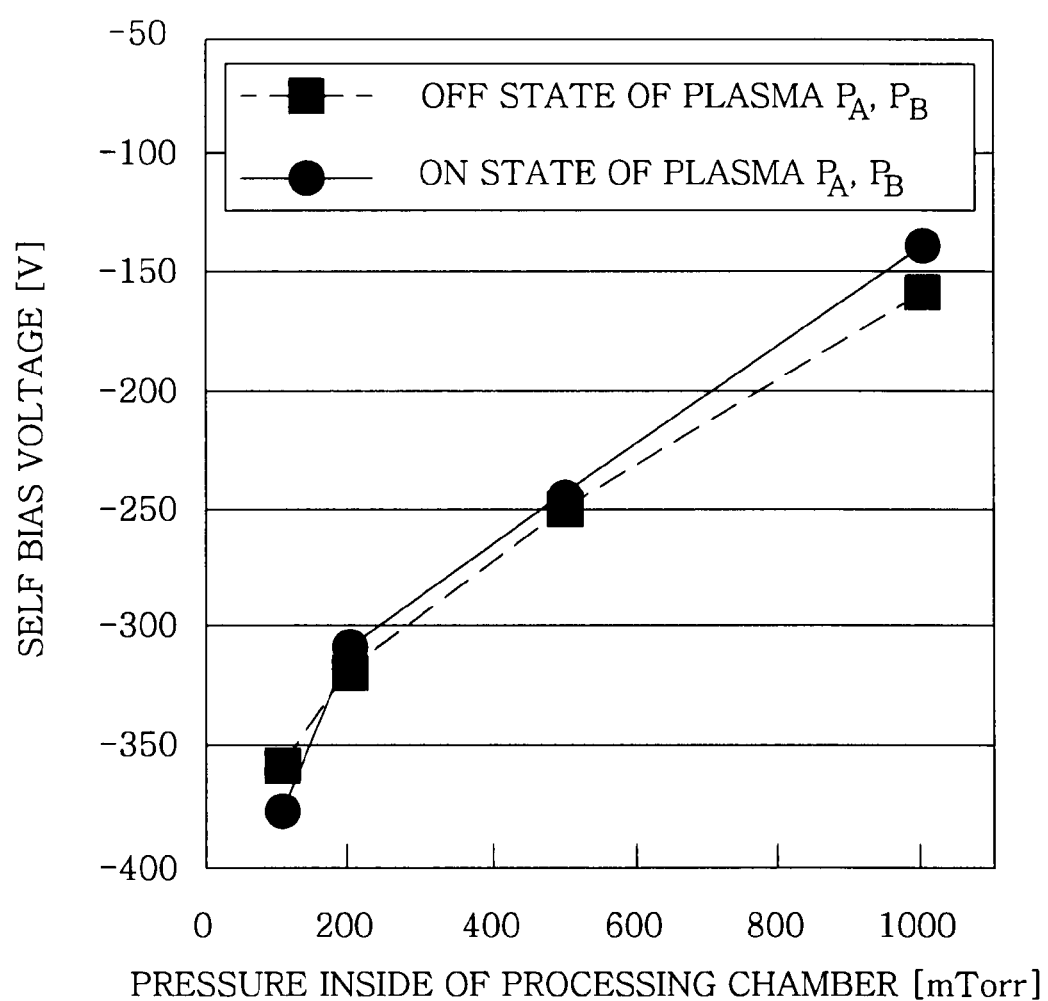
FIG. 20 sets forth a graph depicting relationship between a plasma and a self-bias voltage.

FIG. 20 shows the result of the test for comparing a self bias voltage between a case where plasmas $P_A$ and $P_B$ were generated by the antenna elements 142A and 142B (on state of plasmas $P_A$ and $P_B$) and a case where plasmas were not generated (off state of plasmas $P_A$ and $P_B$). In this test, a self bias voltage generated at the susceptor 316 was detected while maintaining a high frequency power of 13.56 MHz applied to the susceptor 316 at 200 W and varying a pressure in the processing chamber from 100 mTorr to 1000 mTorr.

A graph indicated by '■' in FIG. 20 plots a self bias voltage in the off-state of the plasmas $P_A$ and $P_B$ which was detected while changing a pressure in the processing chamber to 100 mTorr, 200 mTorr, 500 mTorr and 1000 mTorr without applying a high frequency power to the antenna elements 142A and 142B. Further, a graph indicated by '●' plots a self bias voltage in the on-state of the plasmas $P_A$ and $P_B$ which was detected by applying a high frequency power of 27.12 MHz to each of the antenna elements 142A and 142B at a power level of 1000 W, i.e., at a total power level of 2000 W, while changing a pressure in the processing chamber as described above.

In accordance with the test result shown in FIG. 20, the graph indicated by '■' obtained in the off-state of the plasmas $P_A$ and $P_B$ is substantially the same as the graph indicated by '●' obtained in the on-state of the plasmas $P_A$ and $P_B$. In other words, the self bias voltage is hardly changed even though the plasmas $P_A$ and $P_B$ were generated by the high frequency power of 2000 W, which is 10 times greater than that of 200 W applied to the susceptor 316.

Conventionally, a bias high frequency is set while considering variation in a self bias voltage by the plasma generation. However, in the plasma processing apparatus 101 of the present embodiment, a bias high frequency can be set without considering variation in a self bias voltage, and bias control effects obtained therefrom can be applied to the plasma processing.

The configuration of the mounting table 300 is not limited to that shown in FIG. 1. For example, the mounting table 300 may be configured to be raised and lowered by an elevation mechanism (not shown) using an aluminum bellows inserted between the insulating plate 312 and the bottom surface of the processing chamber 102. Accordingly, the distance between the wafer W and the plasmas $P_A$ and $P_B$ generated in the processing chamber 102 can be adjusted.

While the invention has been shown and described with respect to the embodiments, it will be understood by those skilled in the art that various changes and modification may be made without departing from the scope of the invention as defined in the following claims.

Although a high frequency antenna in which a single inner antenna element and a single outer antenna element are coaxially arranged has been described as an example in the above-described embodiment, it is not limited thereto. However, either one or both of the inner antenna element and the outer antenna element may be divided into more than two parts and arranged in a coaxial shape. In that case, each of the antenna elements has both open ends and is grounded at a central point of a length in a winding direction or a point close thereto. The antenna elements are preferably made to resonate at ½ wavelength of high frequencies of the high frequency power supplies. In addition, the antenna elements are partitioned by a cylindrical shield wall, and shield plates are provided so as to cover openings above the antenna elements. Furthermore, it is preferable to control the heights of the shield plates of the antenna elements individually.

In addition, the antenna elements are not necessarily arranged in a coaxial shape, and may be arranged adjacent to each other. For example, a plurality of outer antenna elements having the same shape (spiral shape, square shape or the like) as that of the inner antenna element may be arranged adjacent to each other so as to surround a periphery of the inner antenna element. In addition to the inner antenna element, the outer antenna elements having both open ends and grounded at central points of a length in a winding direction or points close thereto are preferably made to resonate at ½ wavelength of high frequencies from the high frequency power supplies.

The present invention can be applied to a plasma processing apparatus for performing predetermined processing on a substrate to be processed by exciting a plasma of a processing gas.

What is claimed is:

1. A plasma processing apparatus for performing a plasma processing on a substrate to be processed by generating an inductively coupled plasma of a processing gas in a depressurized processing chamber, the plasma processing apparatus comprising:
   a mounting table, provided in the processing chamber, for mounting thereon the substrate to be processed;
   a gas supply unit for introducing the processing gas into the processing chamber;
   a gas exhaust unit for depressurizing the inside of the processing chamber;
   a planar high frequency antenna disposed opposite to the susceptor with a plate-shaped dielectric member therebetween; and
   a shield member covering the high frequency antenna,
   wherein the high frequency antenna includes an inner antenna element provided at a central portion of a region above the plate-shaped dielectric member and an outer antenna element provided at an edge portion of the region above the plate-shaped dielectric member to surround a periphery of the inner antenna element,
   wherein two ends of each of the antenna elements are open ends and the antenna elements are grounded at central points thereof or points close thereto to resonate at ½ wavelengths of high frequencies from individual high frequency power supplies,
   wherein the shield member includes: a cylindrical inner shield wall disposed between the antenna elements to surround the inner antenna element; a cylindrical outer shield wall disposed to surround the outer antenna element; an inner shield plate disposed above the inner antenna element to cover an opening of the inner shield wall; and an outer shield plate disposed above the outer antenna element to cover an opening between the inner and the outer shield wall, and
   wherein the shield plates are provided with shield height adjusting mechanisms for independently adjusting distances between the shield plates and the antenna elements, respectively.

2. The plasma processing apparatus of claim 1, wherein the high frequency antenna includes an antenna height adjusting mechanism for adjusting distance between each of the antenna elements and the plate-shaped dielectric member.

3. The plasma processing apparatus of claim 2, wherein the antenna height adjusting mechanism has a unit for adjusting the distance between the inner antenna element and the plate-shaped dielectric member by moving the inner antenna element and a unit for adjusting the distance between the outer antenna element and the plate-shaped dielectric member by moving the outer antenna element.

4. The plasma processing apparatus of claim 1, further comprising a control unit for controlling the high frequency power supplies to apply different high frequency powers to the antenna elements.

5. The plasma processing apparatus of claim 4, wherein the control unit controls the high frequency power supplies to apply high frequency powers to the antenna elements alternately at regular intervals by a pulse modulation method.

6. The plasma processing apparatus of claim 5, wherein the control unit switches on a high frequency output of one of the high frequency power supplies right before a high frequency output of the other of the high frequency power supplies is switched off.

7. The plasma processing apparatus of claim 1, wherein resonance frequencies of the antenna elements are automatically optimized by adjusting heights of the shield plates by controlling the shield height adjusting mechanisms in accordance with reflection wave powers detected by high frequency power meters provided at output sides of the high frequency power supplies, respectively.

8. The plasma processing apparatus of claim 1, wherein each of the antenna elements is formed in a spiral coil shape.

9. The plasma processing apparatus of claim 1, wherein the outer antenna element is arranged in a coaxial shape with respect to the inner antenna element to surround the periphery of the inner antenna element.

10. The plasma processing apparatus of claim 1, wherein a plurality of outer antenna elements is arranged adjacent to one another to surround the periphery of the inner antenna element.

11. The plasma processing apparatus of claim 1, wherein either one or both of the inner antenna element and the outer antenna element are divided into at least two parts and arranged in a coaxial shape.

12. The plasma processing apparatus of claim 1, wherein a power supply point to which the high frequency power is supplied from said one of the high frequency power supplies is provided between the ground point and one of the open ends of each of the antenna elements.

13. The plasma processing apparatus of claim 12, wherein the location of the power supply point is configured to be varied.

14. The plasma processing apparatus of claim 1, wherein a winding diameter, a winding pitch and the number of turns of each of the antenna elements are set so that each of the antenna elements resonates at the ½ wavelength of the high frequency power supplied from said one of the high frequency power supply.

15. The plasma processing apparatus of claim 1, further comprising a clamping body supporting at least one of the antenna elements and a protrusion provided at the clamping body to protrude outwardly from the shield member, and
   wherein a height of said at least one of the antenna elements is adjusted by moving the protrusion vertically.

16. A plasma processing apparatus for performing a plasma processing on a substrate to be processed by generating an inductively coupled plasma of a processing gas in a depressurized processing chamber, the plasma processing apparatus comprising:

a susceptor, provided in the processing chamber, for mounting thereon the substrate to be processed;

a high frequency susceptor power supply for applying a high frequency power to the susceptor;

a gas supply unit for introducing a processing gas into the processing chamber;

a gas exhaust unit for depressurizing the inside of the processing chamber;

a planar high frequency antenna disposed opposite to the susceptor with a plate-shaped dielectric member therebetween; and a shield member covering the high frequency antenna, wherein the high frequency antenna includes an inner antenna element disposed at a central portion of a region above the plate-shaped dielectric member and an outer antenna element provided to surround a periphery of the inner antenna element, wherein two ends of each of the antenna elements are open ends and the antenna elements are grounded at central points thereof or points close thereto to resonate at ½ wavelengths of high frequencies from individual high frequency antenna power supplies, wherein the shield member includes: a cylindrical inner shield wall disposed between the antenna elements to surround the inner antenna element; a cylindrical outer shield wall disposed to surround the outer antenna element; an inner shield plate disposed above the inner antenna element to cover an opening of the inner shield wall; and an outer shield plate disposed above the outer antenna element to cover an opening between the inner and the outer shield wall, and wherein the shield plates are provided with shield height adjusting mechanisms for independently adjusting distances between the shield plates and the antenna elements, respectively.

17. The plasma processing apparatus of claim 16, wherein the outer antenna element is arranged in a coaxial shape with respect to the inner antenna element to surround the periphery of the inner antenna element.

18. The plasma processing apparatus of claim 16, wherein a plurality of outer antenna elements is arranged adjacent to one another to surround the periphery of the inner antenna element.

19. The plasma processing apparatus of claim 16, wherein either one or both of the inner antenna element and the outer antenna element are divided into at least two parts and arranged in a coaxial shape.

* * * * *